United States Patent
Eitan

(10) Patent No.: US 6,768,165 B1
(45) Date of Patent: *Jul. 27, 2004

(54) TWO BIT NON-VOLATILE ELECTRICALLY ERASABLE AND PROGRAMMABLE SEMICONDUCTOR MEMORY CELL UTILIZING ASYMMETRICAL CHARGE TRAPPING

(75) Inventor: Boaz Eitan, Ra'anana (IL)

(73) Assignee: Saifun Semiconductors Ltd., Netanya (IL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/905,286

(22) Filed: Aug. 1, 1997

(51) Int. Cl.7 ................................................. G11C 7/00
(52) U.S. Cl. ..................................... 257/324; 257/317
(58) Field of Search ............................... 257/324, 317, 257/314–316; 365/185.01, 185.03, 185.18

(56) References Cited

U.S. PATENT DOCUMENTS 3,895,360 A    7/1975  Cricchi et al.

(List continued on next page.)

FOREIGN PATENT DOCUMENTS

EP    0751560    1/1997

(List continued on next page.)

OTHER PUBLICATIONS

Ma et al., "A Dual–bit Split–Gate EEPROM (DSG) Cell in Contactless Array for Single–Vcc High Density Flash Memories," IEEE (1994), pp. 3.5.1–3.5.4.

(List continued on next page.)

Primary Examiner—Ori Nadav
(74) Attorney, Agent, or Firm—Eitan, Pearl, Latzer & Cohen Zedek, LLP

(57) ABSTRACT

A non-volatile electrically erasable programmable read only memory (EEPROM) capable of storing two bit of information having a nonconducting charge trapping dielectric, such as silicon nitride, sandwiched between two silicon dioxide layers acting as electrical insulators is disclosed. The invention includes a method of programming, reading and erasing the two bit EEPROM device. The nonconducting dielectric layer functions as an electrical charge trapping medium. A conducting gate layer is placed over the upper silicon dioxide layer. A left and a right bit are stored in physically different areas of the charge trapping layer, near left and right regions of the memory cell, respectively. Each bit of the memory device is programmed in the conventional manner, using hot electron programming, by applying programming voltages to the gate and to either the left or the right region while the other region is grounded. Hot electrons are accelerated sufficiently to be injected into the region of the trapping dielectric layer near where the programming voltages were applied to. The device, however, is read in the opposite direction from which it was written, meaning voltages are applied to the gate and to either the right or the left region while the other region is grounded. Two bits are able to be programmed and read due to a combination of relatively low gate voltages with reading in the reverse direction. This greatly reduces the potential across the trapped charge region. This permits much shorter programming times by amplifying the effect of the charge trapped in the localized trapping region associated with each of the bits. In addition, both bits of the memory cell can be individually erased by applying suitable erase voltages to the gate and either left or right regions so as to cause electrons to be removed from the corresponding charge trapping region of the nitride layer.

36 Claims, 15 Drawing Sheets

U.S. PATENT DOCUMENTS

| | | |
|---|---|---|
| 4,016,588 A | 4/1977 | Ohya et al. |
| 4,017,888 A | 4/1977 | Christie et al. |
| 4,151,021 A | 4/1979 | McElroy |
| 4,173,766 A | 11/1979 | Hayes |
| 4,173,791 A | 11/1979 | Bell |
| 4,257,832 A | 3/1981 | Schwabe et al. |
| 4,306,353 A | 12/1981 | Jacobs et al. |
| 4,342,149 A | 8/1982 | Jacobs et al. |
| 4,360,900 A | 11/1982 | Bate |
| 4,380,057 A | 4/1983 | Kotecha et al. |
| 4,471,373 A | 9/1984 | Shimizu et al. |
| 4,521,796 A | 6/1985 | Rajkanan et al. |
| 4,527,257 A | 7/1985 | Cricchi |
| 4,586,163 A | 4/1986 | Koike |
| 4,630,085 A | 12/1986 | Koyama |
| 4,667,217 A | 5/1987 | Janning |
| 4,742,491 A | 5/1988 | Liang et al. |
| 4,769,340 A | 9/1988 | Chang et al. |
| 4,780,424 A | 10/1988 | Holler et al. |
| 4,847,808 A | 7/1989 | Kobatake |
| 4,870,470 A | 9/1989 | Bass, Jr. et al. |
| 4,941,028 A | 7/1990 | Chen et al. |
| 5,021,999 A | 6/1991 | Kohda et al. |
| 5,075,245 A | 12/1991 | Woo et al. |
| 5,104,819 A | 4/1992 | Freiberger et al. |
| 5,159,570 A | 10/1992 | Mitchell et al. ............ 365/185 |
| 5,168,334 A | 12/1992 | Mitchell et al. |
| 5,172,338 A | 12/1992 | Mehrotra et al. .......... 365/185 |
| 5,175,120 A | 12/1992 | Lee |
| 5,214,303 A | 5/1993 | Aoki |
| 5,260,593 A | 11/1993 | Lee |
| 5,293,563 A | 3/1994 | Ohta |
| 5,295,108 A | 3/1994 | Higa |
| 5,305,262 A | 4/1994 | Yoneda |
| 5,311,049 A | 5/1994 | Tsuruta |
| 5,324,675 A | 6/1994 | Hayabuchi |
| 5,338,954 A | 8/1994 | Shimoji ..................... 257/326 |
| 5,345,425 A | 9/1994 | Shikatani |
| 5,349,221 A * | 9/1994 | Shimoji ..................... 257/324 |
| 5,350,710 A | 9/1994 | Hong et al. |
| 5,359,554 A | 10/1994 | Odake et al. |
| 5,393,701 A | 2/1995 | Ko et al. |
| 5,394,355 A | 2/1995 | Uramoto et al. |
| 5,412,601 A | 5/1995 | Sawada et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,567 A | 6/1995 | Chen |
| 5,424,978 A | 6/1995 | Wada et al. |
| 5,426,605 A | 6/1995 | Van Berkel et al. |
| 5,434,825 A | 7/1995 | Harari |
| 5,436,481 A | 7/1995 | Egawa et al. |
| 5,440,505 A | 8/1995 | Fazio et al. |
| 5,450,341 A | 9/1995 | Sawada et al. |
| 5,450,354 A | 9/1995 | Sawada et al. |
| 5,455,793 A | 10/1995 | Amin et al. |
| 5,467,308 A | 11/1995 | Chang et al. |
| 5,477,499 A | 12/1995 | Van Buskirk et al. ...... 365/218 |
| 5,496,753 A | 3/1996 | Sakurai et al. |
| 5,518,942 A | 5/1996 | Shrivasta |
| 5,523,251 A | 6/1996 | Hong |
| 5,553,018 A | 9/1996 | Wang et al. |
| 5,592,417 A * | 1/1997 | Mirabel ................. 365/185.07 |
| 5,599,727 A | 2/1997 | Hakozaki et al. |
| 5,606,523 A * | 2/1997 | Mirabel ................. 365/185.05 |
| 5,654,568 A * | 8/1997 | Nakao ......................... 257/324 |
| 5,656,513 A | 8/1997 | Wang et al. |
| 5,712,814 A | 1/1998 | Fratin et al. |
| 5,726,946 A | 3/1998 | Yamagata et al. |
| 5,751,037 A | 5/1998 | Aozasa et al. |
| 5,754,475 A * | 5/1998 | Bill et al. ............... 365/185.25 |
| 5,760,445 A | 6/1998 | Diaz |
| 5,768,192 A * | 6/1998 | Eitan ..................... 365/185.14 |
| 5,787,036 A | 7/1998 | Okazawa ............... 365/185.18 |
| 5,793,079 A * | 8/1998 | Georgescu et al. ......... 257/324 |
| 5,801,076 A | 9/1998 | Ghneim et al. |
| 5,812,449 A * | 9/1998 | Song ...................... 365/185.03 |
| 5,825,686 A * | 10/1998 | Schmitt-Landsiedel et al. ...................... 365/185.03 |
| 5,836,772 A | 11/1998 | Chang et al. |
| 5,841,700 A * | 11/1998 | Chang ................... 365/185.18 |
| 5,847,441 A | 12/1998 | Cutter et al. |
| 5,864,164 A | 1/1999 | Wen |
| 5,870,335 A | 2/1999 | Khan et al. |
| 5,903,031 A | 5/1999 | Yamada et al. |
| 5,946,558 A | 8/1999 | Hsu |
| 5,973,373 A | 10/1999 | Krautschneider et al. |
| 6,028,324 A | 2/2000 | Su et al. |

FOREIGN PATENT DOCUMENTS

| | | |
|---|---|---|
| GB | 1297899 | 11/1972 |
| GB | 2157489 | 10/1985 |
| GB | 2 157 489 A | 10/1985 |
| JP | 05021758 | 1/1993 |
| JP | 07193151 | 7/1995 |
| JP | 7-193151 | 7/1995 |
| JP | 09162314 | 6/1997 |
| WO | WO 81/00790 | 3/1981 |
| WO | WO 96/25741 | 8/1996 |

OTHER PUBLICATIONS

IBM Technical Disclosure Bulletin, vol. 35, No. 4B (1992).

T.Y. Chan et al., *A True Single–Transistor Oxide–Nitride–Oxide EEPROM Device*, Mar. 1987, IEEE Electron Device Letters, vol. EDL–8, No. 3, pp. 93–95.

Boaz Eitan et al., *Hot–Electron Injection into the Oxide in n–Channel MOS Devices*, Mar. 1981, IEEE Transactions on Electron Devices, vol. ED–28, No. 3, pp. 328–340.

Lance A. Glasser et al., *The Design and Analysis of VLSI Circuits*, Addison–Wesley Publishing Company, Jul. 1988, Chapter 2, pp. 67–163.

Anirban Roy, "Characterization and Modeling of Charge Trapping and Retention in Novel Multi–Dielectic Nonvolatile Semiconductor Memory Device," *Sherman Fairchild Center Department of Computer Science and Electrical Engineering*, pp. 1–35 (1989).

Chang, J., "Non Volatile Semiconductor Memory Devices," *Proceedings of the IEEE*, vol. 64 No. 7, pp. 1039–1059, Jul., 1976.

Lee, H., "A New Approach For the Floating–Gate Mos NonVolatile Memory", *Applied Physics Letters*, vol. 31, No. 7, pp. 475–6, Oct., 1977.

Oshima et al., "Process and Device Technologies for 16Mbit Eproms with Large—Tilt—Angle implanted P–Pocket Cell," *IEEE*, CH2865–4/90/0000–0095, pp. 5.2.1–5.4.4, 1990.

"2 Bit/Cell EEPROM Cell Using Band–To–Band Tunneling For Data Read–Out," *IBM Technical Disclosure Bulletin*, U.S. IBM Corp. NY vol. 35, No. 4B, ISSN:0018–8689, pp. 136–140, Sep., 1992.

Hsing–Huang Tseng et al. "Thin CVD Stacked Gate Dielectric for ULSI Technology", *IEEE*, 0–7803–1450–6, pp. 321–324, 1993.

Pickar, K.A., "Ion Implantation in Silicon," *Applied Solid State Science*, vol. 5, R. Wolfe Edition, Academic Press, New York, pp. 151–249, 1975.

Bhattacharyya et al., "FET Gate Structure for Nonvolatile N–Channel Read–Mostly Memory Device," *IBM Technical Disclosure Bulletin*, U.S. IBM Corp. vol. 18, No. 6, p. 1768, Nov., 1975.

* cited by examiner

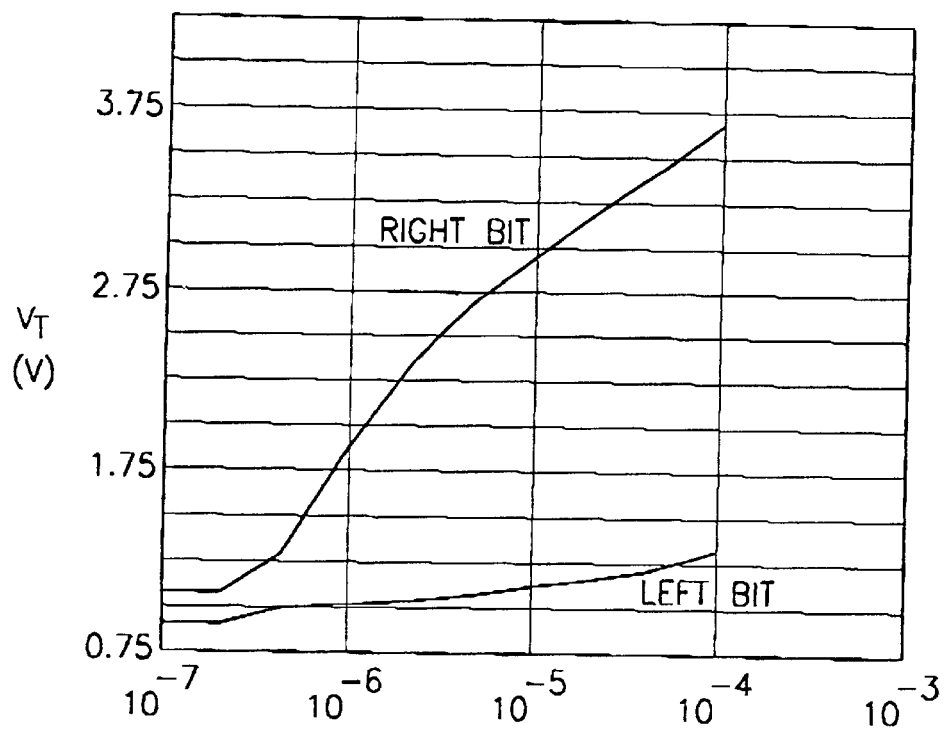
FIG.13 PROGRAMMING TIME (S)
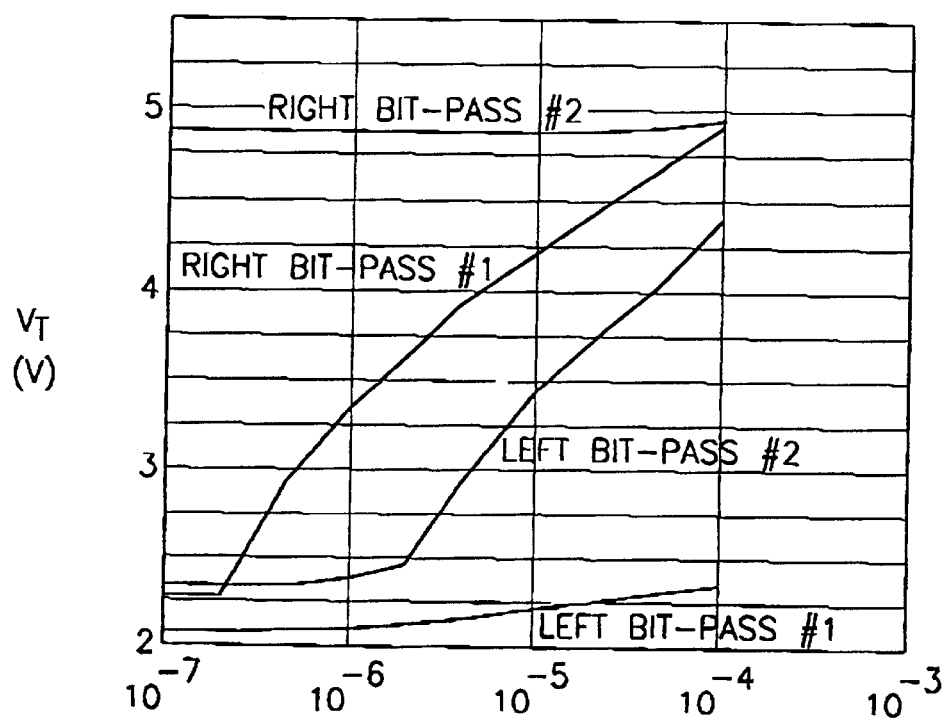
FIG.14 PROGRAMMING TIME (S)

TWO BIT NON-VOLATILE ELECTRICALLY ERASABLE AND PROGRAMMABLE SEMICONDUCTOR MEMORY CELL UTILIZING ASYMMETRICAL CHARGE TRAPPING

FIELD OF THE INVENTION

The present invention relates generally to semiconductor memory devices and more particularly to multi-bit flash electrically erasable programmable read only memory (EEPROM) cells that utilize the phenomenon of hot electron injection to trap charge within a trapping dielectric material within the gate.

BACKGROUND OF THE INVENTION

Memory devices for non-volatile storage of information are currently in widespread use today, being used in a myriad of applications. A few examples of non-volatile semiconductor memory include read only memory (ROM), programmable read only memory (PROM), erasable programmable read only memory (EPROM), electrically erasable programmable read only memory (EEPROM) and flash EEPROM.

Semiconductor ROM devices, however, suffer from the disadvantage of not being electrically programmable memory devices. The programming of a ROM occurs during one of the steps of manufacture using special masks containing the data to be stored. Thus, the entire contents of a ROM must be determined before manufacture. In addition, because ROM devices are programmed during manufacture, the time delay before the finished product is available could be six weeks or more. The advantage, however, of using ROM for data storage is the low cost per device. However, the penalty is the inability to change the data once the masks are committed to. If mistakes in the data programming are found they are typically very costly to correct. Any inventory that exists having incorrect data programming is instantly obsolete and probably cannot be used. In addition, extensive time delays are incurred because new masks must first be generated from scratch and the entire manufacturing process repeated. Also, the cost savings in the use of ROM memories only exist if large quantities of the ROM are produced.

Moving to EPROM semiconductor devices eliminates the necessity of mask programming the data but the complexity of the process increases drastically. In addition, the die size is larger due to the addition of programming circuitry and there are more processing and testing steps involved in the manufacture of these types of memory devices. An advantage of EPROMs are that they are electrically programmed, but for erasing, EPROMs require exposure to ultraviolet (UV) light. These devices are constructed with windows transparent to UV light to allow the die to be exposed for erasing, which must be performed before the device can be programmed. A major drawback to these devices is that they lack the ability to be electrically erased. In many circuit designs it is desirable to have a non-volatile memory device that can be erased and reprogrammed in-circuit, without the need to remove the device for erasing and reprogramming.

Semiconductor EEPROM devices also involve more complex processing and testing procedures than ROM, but have the advantage of electrical programming and erasing. Using EEPROM devices in circuitry permits in-circuit erasing and reprogramming of the device, a feat not possible with conventional EPROM memory. Flash EEPROMs are similar to EEPROMs in that memory cells can be programmed (i.e., written) and erased electrically but with the additional ability of erasing all memory cells at once, hence the term flash EEPROM. The disadvantage of flash EEPROM is that it is very difficult and expensive to manufacture and produce.

The widespread use of EEPROM semiconductor memory has prompted much research focusing on constructing better memory cells. Active areas of research have focused on developing a memory cell that has improved performance characteristics such as shorter programming times, utilizing lower voltages for programming and reading, longer data retention times, shorter erase times and smaller physical dimensions. One such area of research involves a memory cell that has an insulated gate. The following prior art reference is related to this area.

U.S. Pat. No. 4,173,766, issued to Hayes, teaches a metal nitride oxide semiconductor (MNOS) constructed with an insulated gate having a bottom silicon dioxide layer and a top nitride layer. A conductive gate electrode, such as polycrystalline silicon or metal, is placed on top of the nitride layer. A major disadvantage of this device is the difficulty in using it to construct a flash EEPROM. A consequence of using an oxide-nitride structure as opposed to an oxide-nitride-oxide structure is that during programming the charge gets distributed across the entire nitride layer. The absence of the top oxide layer lowers the ability to control where the charge is stored in the nitride layer.

Further, in the memory cell disclosed in Hayes, the nitride layer is typically 350 Angstroms thick. A thick nitride layer is required in Hayes' device in order to achieve sufficient charge retention. Since the nitride can only tolerate relatively small internal electric fields, a thick layer of nitride is required to compensate. Due to the thick nitride layer, very high vertical voltages are needed for erasing. The relatively thick nitride layer causes the distribution of charge, i.e., the charge trapping region, to be very wide and a wider charge trapping region makes erasing the cell via the drain extremely difficult if not impossible. In addition, drain erasing is made difficult because of the increased thickness of the charge trapping layer. Thus, the memory cell taught by Hayes must have a thick nitride layer for charge retention purposes but at the expense of making it extremely difficult to erase the device via the drain, thus making the device impractical for flash EEPROM applications.

To erase the memory cell of Hayes, the electrons previously trapped in the nitride must be neutralized either by moving electrons out of the nitride or by transferring holes into the nitride. Hayes teaches an erase mode for his memory cell whereby the information stored on the nitride is erased by grounding the gate and applying a sufficient potential to the drain to cause avalanche breakdown. Avalanche breakdown involves hot hole injection into the nitride in contrast to electron injection. Avalanche breakdown, however, requires relatively high voltages and high currents for the phenomenon to occur. To lower the avalanche breakdown voltage, a heavily doped impurity is implanted into the channel between the source and the drain.

The hot holes are generated and caused to surmount the hole potential barrier of the bottom oxide and recombine with the electrons in the nitride. This mechanism, however, is very complex and it is difficult to construct memory devices that work in this manner. Another disadvantage of using hot hole injection for erase is that since the PN junction between the drain and the channel is in breakdown, very large currents are generated that are difficult to control.

Further, the number of program/erase cycles that the memory cell can sustain is limited because the breakdown damages the junction area. The damage is caused by the very high local temperatures generated in the vicinity of the junction when it is in breakdown.

In addition, it is impractical to use the memory device of Hayes in a flash memory array architecture. The huge currents generated during erase using avalanche breakdown would cause significant voltage (i.e., IR), drops along the bit line associated with the memory cell in breakdown.

Another well known technique of erasing is to inject holes from the gate into the nitride layer. This mechanism, however, is very complex and difficult to control due to the higher mobility of holes versus electrons in the nitride. With elevated temperatures, the higher mobility of holes causes a large loss of charge retention and consequently lower threshold voltage deltas from the original programming threshold. Deep depletion phenomenon creates the need for a companion serial device to control the programming/erase process.

U.S. Pat. No. 5,168,334, issued to Mitchell et al., teaches a single transistor EEPROM memory cell. Mitchell, however, teaches an oxide-nitride-oxide (ONO) EEPROM memory cell wherein oxide-nitride-oxide layers are formed above the channel area and between the bit lines for providing isolation between overlying polysilicon word lines. The nitride layer provides the charge retention mechanism for programming the memory cell.

Although the memory device of Mitchell includes a top oxide layer, it is not very well suited for flash EEPROM applications. This is due to the very wide charge trapping region that must be programmed in order to achieve a sufficient delta in the threshold voltage between programming and reading. The Mitchell device is programmed and read in the forward direction. Since reading in the forward direction is less effective than reading in the reverse direction, the charge trapping region must be wider by default in order to distinguish between the programmed and unprogrammed states. A wider charge trapping region, however, makes the memory device very difficult to erase, thus making this device inefficient for flash EEPROM applications.

A single transistor ONO EEPROM device is disclosed in the technical article entitled "A True Single-Transistor Oxide-Nitride-Oxide EEPROM Device," T. Y. Chan, K. K. Young and Chenming Hu, IEEE Electron Device Letters, March 1987. The memory cell is programmed by hot electron injection and the injected charges are stored in the oxide-nitride-oxide (ONO) layer of the device. This article teaches programming and reading in the forward direction. Thus, as in Mitchell, a wider charge trapping region is required to achieve a sufficiently large difference in threshold voltages between programming and reading. This, however, makes it much more difficult to erase the device.

Multi-bit transistors are known in the art. Most multi-bit transistors utilize multi-level thresholds to store more than one bit with each threshold level representing a different state. A memory cell having four threshold levels can store two bits. This technique has been implemented in a ROM by using implanting techniques and has also been attempted in FLASH and EEPROM memory. The multi-level threshold technique has not been applied to EPROM memory due to the fact that if the window of a threshold defining a given state is exceeded, a UV erase cycle must be performed which is very cumbersome and costly. In addition, to perform the UV erase, the chip must first be removed from the system which can be very problematic.

Achieving multiple thresholds in FLASH and EEPROM requires an initial erase cycle to bring all the memory cells below a certain threshold. Then, utilizing a methodical programming scheme, the threshold of each cell is increased until the desired threshold is reached. A disadvantage with this technique is that the programming process requires constant feedback which causes multi-level programming to be slow.

In addition, using this technique causes the window of operation to decrease meaning the margins for each state are reduced. This translates to a lower probability of making good dies and a reduction in the level of quality achieved. If it is not desired to sacrifice any margins while increasing the reliability of the cell, then the window of operation must be increased by a factor of two. This means operating at much higher voltages which is not desirable because it lowers the reliability and increases the disturbances between the cells. Due to the complexity of the multi-threshold technique, it is used mainly in applications where missing bits can be tolerated such as in audio applications.

Another problem with this technique is that the threshold windows for each state may change over time reducing the reliability. It must be guaranteed that using the same word line or bit line to program other cells will not interfere with or disturb the data in cells already programmed. In addition, the programming time itself increases to accommodate the multitude of different programming thresholds. Thus, the shifting of threshold windows for each state over time reduces the window of operation and consequently increases the sensitivity to disturbs.

The reduced margins for the threshold windows for the multiple states results in reduced yield. Further, in order to maintain quality and threshold margins, higher voltages are required. This implies higher electric fields in the channel which contributes to lower reliability of the memory cell.

In order to construct a multi-bit ROM memory cell, the cell must have four distinct levels that can be programmed. In the case of two levels, i.e., conventional single bit ROM cell, the threshold voltage programmed into a cell for a '0' bit only has to be greater than the maximum gate voltage, thus making sure the cell does not conduct when it is turned on during reading. It is sufficient that the cell conducts at least a certain amount of current to distinguish between the programmed and unprogrammed states. The current through a transistor can be described by the following equation.

$$I = \frac{1}{L_{\textit{eff}}} K(V_G - V_T)$$

$L_{\textit{eff}}$ is the effective channel length, K is a constant, $V_G$ is the gate voltage and $V_T$ is the threshold voltage. However, in the multi-bit case, different thresholds must be clearly distinguishable which translates into sensing different read currents and slower read speed. Further, for two bits, four current levels must be sensed, each threshold having a statistical distribution because the thresholds cannot be set perfectly. In addition, there will be a statistical distribution for the effective channel length which will further widen the distribution of the read currents for each threshold level.

The gate voltage also affects the distribution of read currents. For the same set of threshold levels, varying the gate voltage directly results in a variation of the ratio between the read currents. Therefore the gate voltage must be kept very stable. In addition, since there are multiple levels of current, sensing becomes more complex than in the two level, i.e., single bit, cell.

The following prior art references are related to multi-bit semiconductor memory cells.

U.S. Pat. No. 5,021,999, issued to Kohda et al., teaches a non-volatile memory cell using an MOS transistor having a floating gate with two electrically separated segmented floating gates. The memory cell can store three levels of data: no electrons on either segment, electrons injected into either one of the two segments and electrons injected into both segments.

U.S. Pat. No. 5,214,303, issued to Aoki, teaches a two bit transistor which comprises a semiconductor substrate, a gate electrode formed on the substrate, a pair of source/drain regions provided in the substrate and an offset step portion formed in at least one of the source/drain regions and downwardly extending into the substrate in the vicinity of the gate electrode.

U.S. Pat. No. 5,394,355, issued to Uramoto et al., teaches a ROM memory having a plurality of reference potential transmission lines. Each reference potential transmission line represents a different level or state. Each memory cell includes a memory cell transistor able to connect one of the reference potential transmission lines to the corresponding bit line.

U.S. Pat. No. 5,414,693, issued to Ma et al., teaches a two bit split gate flash EEPROM memory cell structure that uses one select gate transistor and two floating gate transistors. In this invention essentially each bit is stored in a separate transistor.

U.S. Pat. No. 5,434,825, issued to Harari, teaches a multi-bit EPROM and EEPROM memory cell which is partitioned into three or more ranges of programming charge. The cell's memory window is widened to store more than two binary states. Each cell is programmed to have one of the programmed states. To achieve more than two binary states, multiple negative and positive threshold voltages are used. The cell basically comprises a data storage transistor coupled to a series pass transistor. The data transistor is programmed to one of the predefined threshold states. Sensing circuitry distinguishes the different current levels associated with each programmed state.

SUMMARY OF THE INVENTION

The present invention discloses an apparatus for and method of programming, reading and erasing a two bit flash electrically erasable programmable read only memory (EEPROM). The two bit flash EEPROM memory cell is constructed having a charge trapping non-conducting dielectric layer sandwiched between two silicon dioxide layers. The nonconducting dielectric layer functions as an electrical charge trapping medium. The charge trapping layer is sandwiched between two layers of silicon dioxide which act as electrical insulators. A conducting gate layer is placed over the upper silicon dioxide layer. The two individual bits, i.e., left and right bits, are stored in physically different areas of the charge trapping region.

A novel aspect of the memory device is that while both bits are programmed in the conventional manner, using hot electron programming, each bit is read in a direction opposite that in which it was programmed with a relatively low gate voltage. For example, the right bit is programmed conventionally by applying programming voltages to the gate and the drain while the source is grounded. Hot electrons are accelerated sufficiently to be injected into a region of the trapping dielectric layer near the drain. The device, however, is read in the opposite direction from which it was written, meaning voltages are applied to the gate and the source while the drain is grounded. The left bit is similarly programmed and read by swapping the functionality of source and drain terminals. Programming one of the bits leaves the other bit with its information intact and undisturbed. Programming one of the bits does, however, have a very small effect on the other bit, e.g., slightly slower programming speed for the second bit.

Reading in the reverse direction is most effective when relatively low gate voltages are used. A benefit of utilizing relatively low gate voltages in combination with reading in the reverse direction is that the potential drop across the portion of the channel beneath the trapped charge region is significantly reduced. A relatively small programming region or charge trapping region is possible due to the lower channel potential drop under the charge trapping region. This permits much faster programming times because the effect of the charge trapped in the localized trapping region is amplified. Programming times are reduced while the delta in threshold voltage between the programmed versus unprogrammed states remains the same as when the device is read in the forward direction.

Another major benefit is that the erase mechanism of the memory cell is greatly enhanced. Both bits of the memory cell can be erased by applying suitable erase voltages to the gate and the drain for the right bit and to the gate and the source for the left bit so as to cause electrons to be removed from the charge trapping region of the nitride layer. Electrons move from the nitride through the bottom oxide layer to the drain or the source for the right and the left bits, respectively. Another benefit includes reduced wearout from cycling thus increasing device longevity. An effect of reading in the reverse direction is that a much higher threshold voltage for the same amount of programming is possible. Thus, to achieve a sufficient delta in the threshold voltage between the programmed and unprogrammed states of the memory cell, a much smaller region of trapped charge is required when the cell is read in the reverse direction than when the cell is read in the forward direction.

The erase mechanism is enhanced when the charge trapping region is made as narrow as possible. Programming in the forward direction and reading in the reverse direction permits limiting the width of the charge trapping region to a narrow region near the drain (right bit) or the source. This allows for much more efficient erasing of the memory cell.

Further, utilizing a thinner silicon nitride charge trapping layer than that disclosed in the prior art helps to confine the charge trapping region to a laterally narrower region near the drain. Further, the thinner top and bottom oxide sandwiching the nitride layer helps in retention of the trapped charge.

In addition, unlike prior art floating gate flash EEPROM memory cells, the bottom and top oxide thickness can be scaled due to the deep trapping levels that function to increase the potential barrier for direct tunneling. Since the electron trapping levels are so deep, thinner bottom and top oxides can be used without compromising charge retention.

Another benefit of localized charge trapping is that during erase, the region of the nitride away from the drain does not experience deep depletion since the erase occurs near the drain only. The final threshold of the cell after erasing is self limited by the device structure itself. This is in direct contrast to conventional single transistor floating gate flash memory cells which are plagued with deep depletion problems. To overcome these problems, manufacturers include complex circuitry to control the erase process in order to prevent or recover from deep depletion.

Another approach previously employed in the prior art to solve the deep depletion problem was to design the floating gate flash memory cell using a split gate design forming multiple transistors per cell. The split gate or double transistor constructions were necessary because the information carrying transistor, i.e., the floating gate transistor, potentially could be over erased. An over erase condition caused the threshold voltage of the cell to go too low. The second transistor, acting as a control transistor, prevented the floating gate transistor from being over erased.

Considerations of the two bit memory cell of the present invention are described hereinbelow. The first is the fact that reading in the reverse direction permits read through of the trapping region associated with the other bit. The second is that programming the device to a low $V_T$, by clamping the word line voltage $V_{WL}$, further enhances the margin for each bit. The margin is defined as the parameters that will program one of the bits without affecting the other.

Further, the locality of the trapped charge due to hot electron injection in combination with reverse reading permits two distinct charge trapping regions to be formed in a relatively short device whose $L_{eff}$ is approximately 0.2 microns. Also, utilizing a combination of positive $V_D$ and either zero or negative $V_G$ permits each bit to be erased separately.

The memory device also exhibits little or no disturb during programming. This is because during programming the drain voltage is only applied to the junction adjacent to the region where charge trapping is to occur.

It is important to note that a memory cell constructed in accordance with the present invention cannot store two bits utilizing programming in the forward direction and reading in the forward direction. This is due to the forward read requiring a wider charge trapping region to be programmed in order to achieve a sufficient delta in read currents for a one and a zero. Once one of the bits is programmed, the wider charge trapping region prevents read through to the other bit.

BRIEF DESCRIPTION OF THE DRAWINGS

The invention is herein described, by way of example only, with reference to the accompanying drawings, wherein:

FIG. 13 is a graph illustrating the effect programming one of the bits has on the other bit that has not been previously programmed;

FIG. 14 is a graph illustrating the effect programming one of the bits has on the other bit that has been previously programmed;

DETAILED DESCRIPTION OF THE INVENTION

Figure 1:
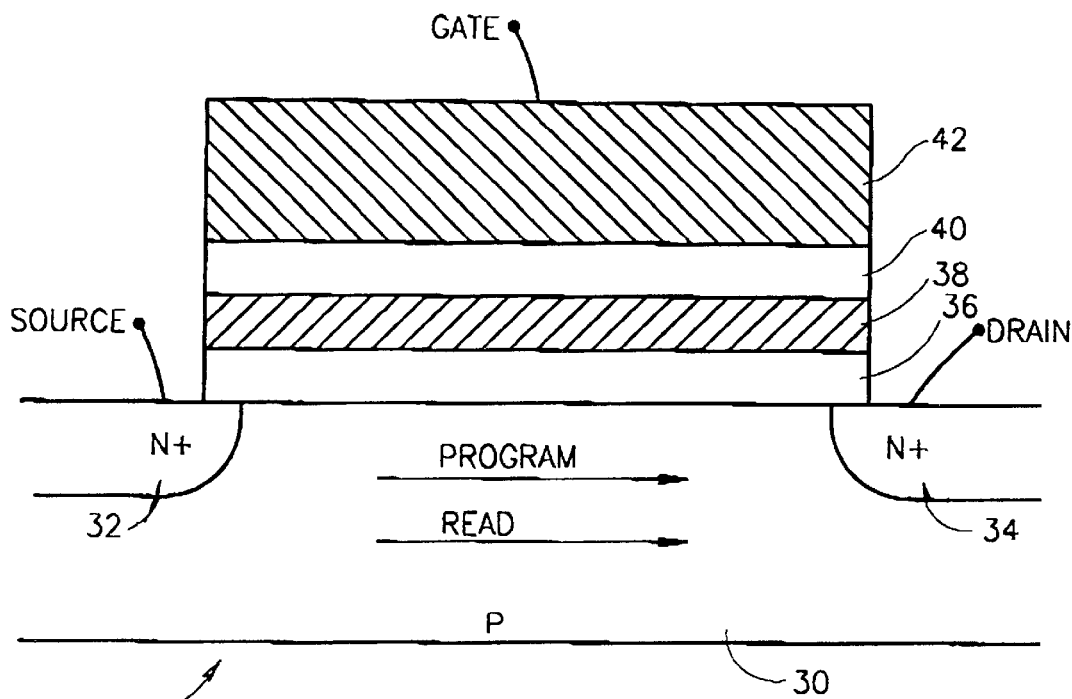
FIG. 1 illustrates a sectional view of a single bit flash EEPROM cell of the prior art utilizing Oxide-Nitride-Oxide (ONO) as the gate dielectric.

The two bit flash EEPROM cell of the present invention can best be understood with an understanding of how present day single bit charge trapping dielectric flash EEPROM memory cells are constructed, programmed and read. Thus, prior art single bit ONO EEPROM memory cells and the conventional method used to program, read and erase them are described in some detail. Illustrated in FIG. 1 is a cross section of a conventional ONO EEPROM memory cell as disclosed in the technical article entitled "A True Single-Transistor Oxide-Nitride-Oxide EEPROM Device," T. Y. Chan, K. K. Young and Chenming Hu, IEEE Electron Device Letters, March 1987, incorporated herein by reference. The memory cell, generally referenced 41, comprises a P-type silicon substrate 30, two PN junctions between N+ source and drain regions 32, 34 and P type substrate 30, a non conducting nitride layer 38 sandwiched between two oxide layers 36, 40 and a polycrystalline conducting layer 42.

Programming Prior Art Single Bit Memory Devices

The operation of the prior art memory cell 41 will now be described. To program or write the cell, voltages are applied to the drain 34 and the gate 42 and the source 32 is grounded. For example, 10V is applied to the gate and 9V is applied to the drain. These voltages generate a vertical and lateral electric field along the length of the channel from the source to the drain. This electric field causes electrons to be drawn off the source and begin accelerating towards the drain. As they move along the length of the channel, they gain energy. If they gain enough energy they are able to jump over the potential barrier of the oxide layer 36 into the silicon nitride layer 38 and become trapped. The probability of this occurring is a maximum in the region of the gate next to the drain 34 because it is near the drain that the electrons gain the most energy. These accelerated electrons are termed hot electrons and once injected into the nitride layer they become trapped and remain stored there. The trapped electrons cannot spread through the nitride layer because of the low conductivity of the nitride layer and the low lateral electric field in the nitride. Thus, the trapped charge remains in a localized trapping region in the nitride typically located close to the drain.

In U.S. Pat. No. 4,173,766, issued to Hayes, the nitride layer is described as typically being about 350 Angstroms thick (see column 6, lines 59 to 61). Further, the nitride layer in Hayes has no top oxide layer. A top oxide layer would serve as a low conductivity layer to prevent holes from moving into the nitride from the overlying gate and combining with electrons trapped in the nitride which reduces the charge stored in the nitride. If the memory cell of Hayes used a thinner nitride layer, then electrons trapped in the nitride layer would be lost to holes entering from the overlying conductive gate. The conductive gate permits the electrons in the nitride to be removed. Further, once the electrons are trapped in a given region of the nitride associated with a single cell, the programming of adjacent cells can cause an electric field to be generated with respect to the electrons in the trapped region of the single cell causing further dissipation of the electrons from the trapped region. During life testing, where the device is subjected to elevated temperatures typically in the range from about 150 degrees Centigrade to 250 degrees Centigrade, holes from the gate can enter the nitride and combine with the electrons to further reduce the amount of charge trapped in the nitride. Although lateral fields exist in the nitride of the Hayes structure as they do in any ONO structure used as gate insulation in an MOS device, the relatively thick nitride layer such as disclosed by Hayes causes the electrons to move laterally in response to this lateral field and come to rest either in traps between the conduction and valence bands or in localized regions of positive charge in the nitride layer. Such movement of electrons, commonly known as electron hopping, can readily occur in a relatively thick nitride layer such as disclosed by Hayes. Such hopping diffuses and thus reduces the localized intensity of the trapped charge.

As previously described, in order to achieve an effective delta in threshold voltage between the unprogrammed and the programmed state of each cell, the charge trapping region of prior art flash EEPROM cells must be made fairly wide. Thus, electrons are trapped in areas far from the drain which directly affects the effectiveness of the erase. In some cases, the device cannot be erased at all because the charge trapping region was programmed too wide.

In memory cells constructed using a conductive floating gate, the charge that gets injected into the gate is distributed equally across the entire gate. The threshold voltage of the entire gate increases as more and more charge is injected into the gate. The threshold voltage increases because the electrons that become stored in the gate screen the gate voltage from the channel.

With reference to FIG. 1, in devices with low conductivity or non conductive floating gates, the injection of hot electrons into the silicon nitride layer causes the gate threshold voltage to increase only in the localized trapping region. This is in contrast to the conductive floating gate memory cells of EPROMs and EEPROMs wherein the gate threshold voltage of the entire channel rises as programming time increases. In both conductive and non conductive floating gate memory cell designs, an increase in the gate threshold voltage causes the current flowing through the channel to decrease for a given gate voltage. This reduces programming efficiency by lengthening the programming time. However, due to the localized electron trapping in the non conductive floating gate memory cell design, the programming time is reduced less than with the conductive floating gate memory cell design. The technique of programming flash EEPROM memory cells with either conductive or low conductivity or non conductive floating gates is well known in the art and is currently used to program EEPROM and flash EEPROM memory cells.

Reading Prior Art Single Bit Memory Devices

The method of reading prior art flash EEPROM memory cells will now be described. The conventional technique of reading both prior art conductive floating gate and non conductive localized trapping gate EEPROM or flash EEPROM memory is to apply read voltages to the gate and drain and to ground the source. This is similar to the method of programming with the difference being that lower level voltages are applied during reading than during programming. Since the floating gate is conductive, the trapped charge is distributed evenly throughout the entire floating conductor. In a programmed device, the threshold is therefore high for the entire channel and the process of reading becomes symmetrical. It makes no difference whether voltage is applied to the drain and the source is grounded or vice versa. A similar process is also used to read prior art non conductive localized gate flash EEPROM devices.

The process of programming typically includes writing followed by reading. This is true for all EPROM and EEPROM memory devices. A short programming pulse is applied to the device followed by a read. The read is actually used to effectively measure the gate threshold voltage. By convention, the gate threshold voltage is measured by applying a voltage to the drain and a separate voltage to the gate, with the voltage on the gate being increased from zero while the channel current flowing from drain to source is measured. The gate voltage that provides 1 p.A of channel current is termed the threshold voltage.

Typically, programming pulses (i.e., write pulses) are followed by read cycles wherein the read is performed in the same direction that the programming pulse is applied. This is termed symmetrical programming and reading. Programming stops when the gate threshold voltage has reached a certain predetermined point (i.e., the channel current is reduced to a sufficiently low level). This point is chosen to ensure that a '0' bit can be distinguished from a '1' bit and that a certain data retention time has been achieved.

The Two Bit Memory Device of the Present Invention

Figure 2:
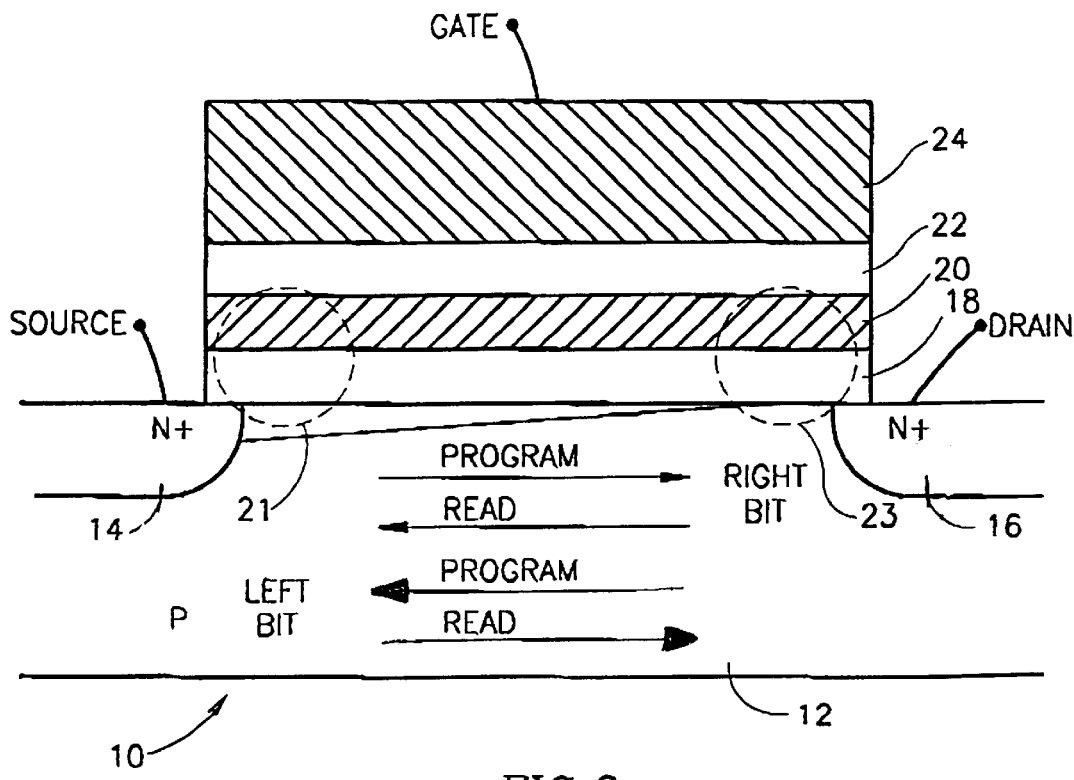
FIG. 2 illustrates a sectional view of a two bit flash EEPROM cell constructed in accordance with an embodiment of the present invention utilizing ONO as the gate dielectric.

A sectional view of a two bit flash EEPROM cell constructed in accordance with an embodiment of the present invention utilizing ONO as the gate dielectric is shown in FIG. 2. The flash EEPROM memory cell, generally referenced 10, comprises a P-type substrate 12 having two buried PN junctions, one being between the source 14 and substrate 12, termed the left junction and the other being between the drain 16 and the substrate 12, termed the right junction. Above the channel is a layer of silicon dioxide 18, preferably between approximately 60 to 100 Angstroms thick, which forms an electrical isolation layer over the channel. On top of the silicon dioxide layer 18 is a charge trapping layer 20 constructed preferably in the range of 20 to 100 Angstroms thick and preferably comprised of silicon nitride, $Si_3N_4$. The hot electrons are trapped as they are injected into the charge trapping layer. In this fashion, the charge trapping layer serves as the memory retention layer. Note that the programming, reading and erasing of the memory cell of the present invention is based on the movement of electrons as opposed to movement of holes. The charge trapping dielectric can be constructed using silicon nitride, silicon dioxide with buried polysilicon islands or implanted oxide, for example. In the third listed alternative, the oxide can be implanted with arsenic, for example. The thickness of layer 18 is chosen to be in excess of 50 Angstroms to prevent electrons from tunneling through the oxide and leaving charge trapping layer 20 during the operation of the cell. Thus the lifetime of the cell of this invention is greatly extended relative to prior art MNOS devices. The memory cell 10 is capable of storing two bits of data, a right bit represented by the dashed circle 23 and a left bit represented by the dashed circle 21.

It is important to note that the two bit memory cell of the present invention is a symmetrical device. Therefore, the terms source and drain as used with conventional one bit devices may be confusing. In reality, the left junction serves as the source terminal and the right junction serves as the drain terminal for the right bit. Similarly, for the left bit, the right junction serves as the source terminal and the left junction serves as the drain terminal. Thus, to avoid confusion, the terms left or first junction and right or second junction are utilized most of the time rather than source and drain. When the distinction between left and right bits is not crucial to the particular discussion, the terms source and drain are utilized. However, it should be understood that the source and drain terminals for the second bit are reversed compared to the source and drain terminals for the first bit.

Another layer of silicon dioxide 22 is formed over the charge trapping layer, (i.e., silicon nitride layer), and is preferably between approximately 60 to 100 Angstroms thick. The silicon dioxide layer 22 functions to electrically isolate a conductive gate 24 formed over the silicon dioxide layer 22 from charge trapping layer 20. The thickness of gate 24 is approximately 4,000 Angstroms. Gate 24 can be constructed from polycrystalline silicon, commonly known as polysilicon.

Figure 3:
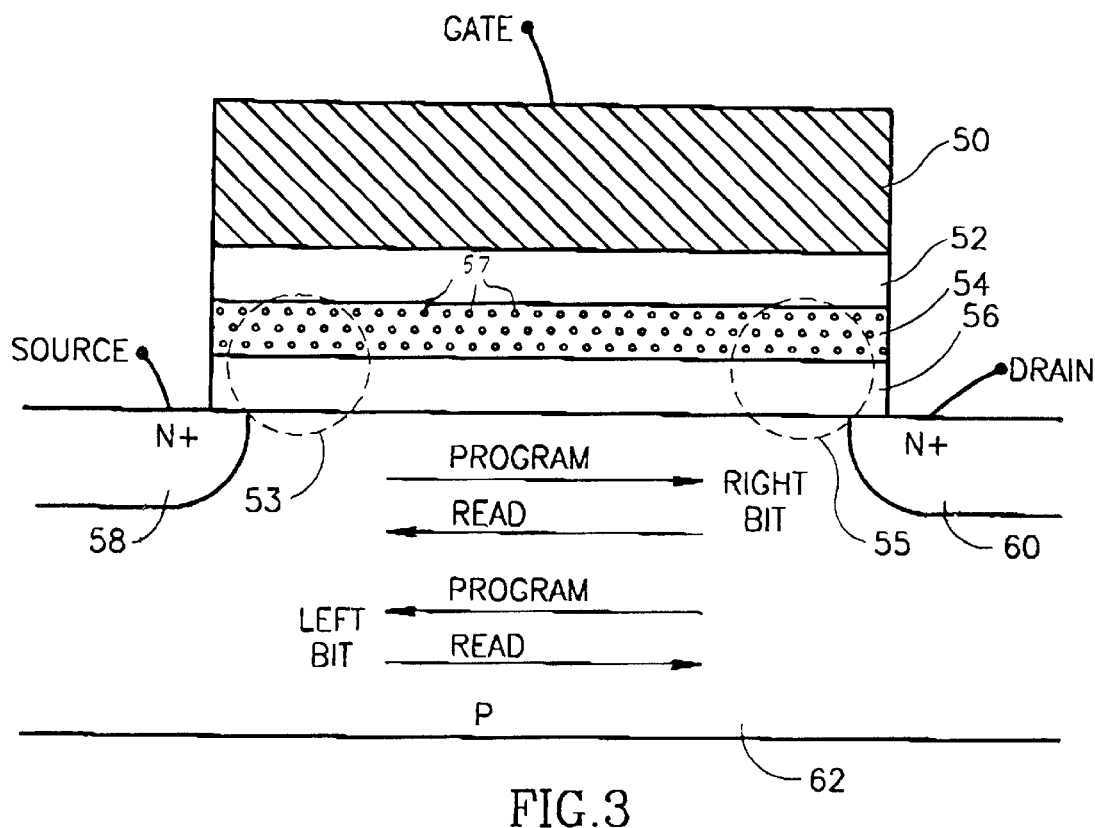
FIG. 3 illustrates a sectional view of a two bit flash EEPROM cell constructed in accordance with an embodiment of the present invention utilizing a silicon rich silicon dioxide with buried polysilicon islands as the gate dielectric.

Charge trapping dielectric materials other than nitride may also be suitable for use as the asymmetric charge trapping medium. One such material is silicon dioxide with buried polysilicon islands. The silicon dioxide with polysilicon islands is sandwiched between two layers of oxide in similar fashion to the construction of the ONO memory cell in FIG. 2. A sectional view of a two bit flash EEPROM cell constructed in accordance with a preferred embodiment of the present invention utilizing a silicon rich silicon dioxide layer 54 with buried polysilicon islands 57 as the gate dielectric is illustrated in FIG. 3. Note that for simplicity, only a few polysilicon islands are numbered. A P-type substrate 62 has buried N+ source 58 and N+ drain 60 regions. The silicon dioxide 54 with buried polysilicon islands 57 is sandwiched between two layers of silicon dioxide 52, 56. Covering oxide layer 52 is polysilicon gate 50. Gate 50 is typically heavily doped with an N-type impurity such as phosphorus in the $10^{19}$ to $10^{20}$ atom/cc range. Similar to the two bit memory cell of FIG. 2, the memory cell of FIG. 3 is capable of storing two data bits, a right bit represented by the dashed circle 55 and a left bit represented by the dashed circle 53. The operation of the memory cell of FIG. 3 is similar to that of the memory cell illustrated in FIG. 2 with programming and reading occurring in opposite directions for each bit.

Alternatively, the charge trapping dielectric can be constructed by implanting an impurity, such as arsenic, into a middle layer 54 of silicon dioxide deposited on top of the bottom oxide 56.

A key aspect of the present invention lies in the manner in which the flash EEPROM memory cell 10 (FIG. 2) is programmed and read. Rather than performing symmetrical programming and reading, the flash EEPROM memory cell of the present invention is programmed and read asymmetrically. This means that programming and reading occur in opposite directions. The arrows labeled PROGRAM and READ for each bit (i.e. the left bit and the right bit) in FIG. 2 point in opposite directions to signify this asymmetry. Thus, programming is performed in what is termed the forward direction and reading is performed in what is termed the opposite or reverse direction.

It is noted that throughout the discussion of the EEPROM memory cell of the present invention presented below, the voltage levels discussed in connection therewith are assumed to be independent of the power supply voltage. Thus, the power supply voltages supplied to the chip embodying the EEPROM memory device may vary while the voltages applied to the gate, drain and source thereof will be supplied from regulated voltage sources.

Programming One Bit in the Forward Direction

As previously mentioned, the flash EEPROM memory cell 10 of FIG. 2 is programmed similarly to the prior art flash EEPROM memory cell of FIG. 1. Voltages are applied to the gate 24 and drain 16 creating vertical and lateral electrical fields which accelerate electrons from the source 14 along the length of the channel. As the electrons move along the channel some of them gain sufficient energy to jump over the potential barrier of the bottom silicon dioxide layer 18 and become trapped in the silicon nitride layer 20. For the right bit, for example, the electron trapping occurs in a region near the drain 16 indicated by the dashed circle 23 in FIG. 2. Thus the trapped charge is self-aligned to the junction between the drain 16 and the substrate. Electrons are trapped in the portion of nitride layer 20 near but above and self-aligned with the drain region 16 because the electric fields are the strongest there. Thus, the electrons have a maximum probability of being sufficiently energized to jump the potential barrier of the silicon dioxide layer 18 and become trapped in the nitride layer 20 near the drain 16. The threshold voltage of the portion of the channel between the source 14 and drain 16 under the region of trapped charge increases as more electrons are injected into the nitride layer 20.

It is important to note that in order to be able to subsequently erase memory device 10 effectively, the programming time period must be limited. As the device continues to be programmed, the width of the charge trapping region increases. If programming continues past a certain point the charge trapping region becomes too wide whereby erasing is ineffective in removing trapped charge from the nitride layer 20.

However, by reading in the reverse direction, programming times can be shortened. This permits a much narrower charge trapping region. This in turn greatly increases the erase efficiency since fewer electrons need to be removed to erase the device. In addition, the trapped electrons are stored in a narrower region near the drain also improving the effectiveness of the erase.

Reading One Bit in the Forward Direction

If the flash EEPROM memory cell 10 is read using the conventional technique of reading in the same direction as programming, the time needed to program the device greatly increases to achieve the same threshold voltage. Reading in the same direction as programming means the device is programmed and read in the same forward direction. During reading, voltages having levels lower than the voltages applied during programming are applied to the gate and drain and the channel current are sensed. If device 10 is programmed (i.e., a logic '0') the channel current should be very low and if the device is not programmed (i.e., a logic '1') there should be significant channel current generated. Preferably, the difference in the channel current between the '0' and '1' logic states should be maximized in order to better distinguish between the '0' and '1' logic states.

Figure 4:
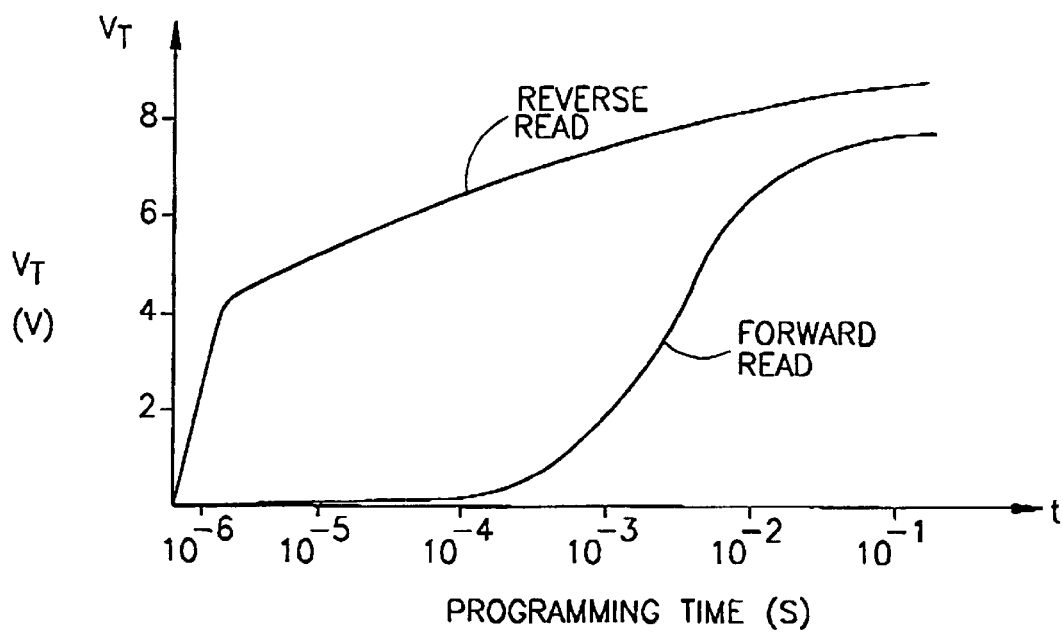
FIG. 4 is a graph illustrating the threshold voltage as a function of programming time for reading in the forward and reverse directions of a selected memory cell in accordance with this invention.

Illustrated in FIG. 4 is a graph showing the rise in gate threshold voltage as a function of programming time for reading in the forward direction (curve labeled FORWARD READ) and for reading in the reverse direction (curve labeled REVERSE READ). Apparent from the graph in FIG. 4 is the several orders of magnitude reduction in programming time achieved when reading in the reverse direction versus reading in the forward direction. As is described in more detail below, this dramatic reduction in programming time is due to amplification of the effect of the trapped charge injected into the nitride layer brought about by reading the memory cell in the opposite direction from which it was programmed.

Figure 5A:
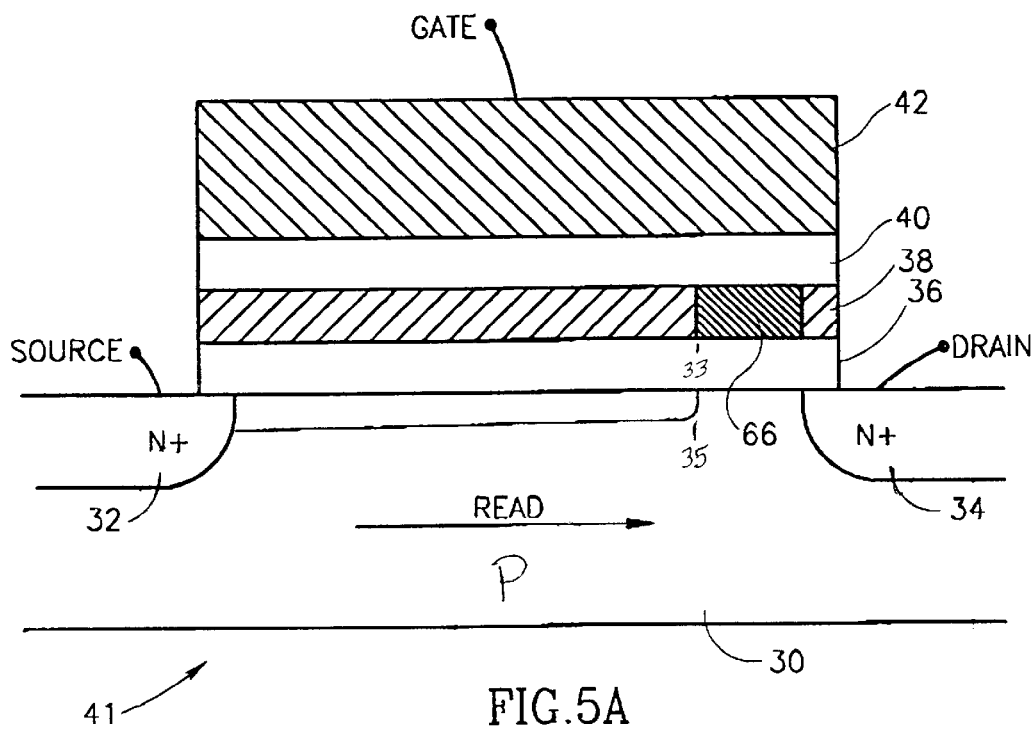
FIG. 5A illustrates a sectional view of a flash EEPROM cell of the prior art showing the area of charge trapping under the gate.
Figure 5B:
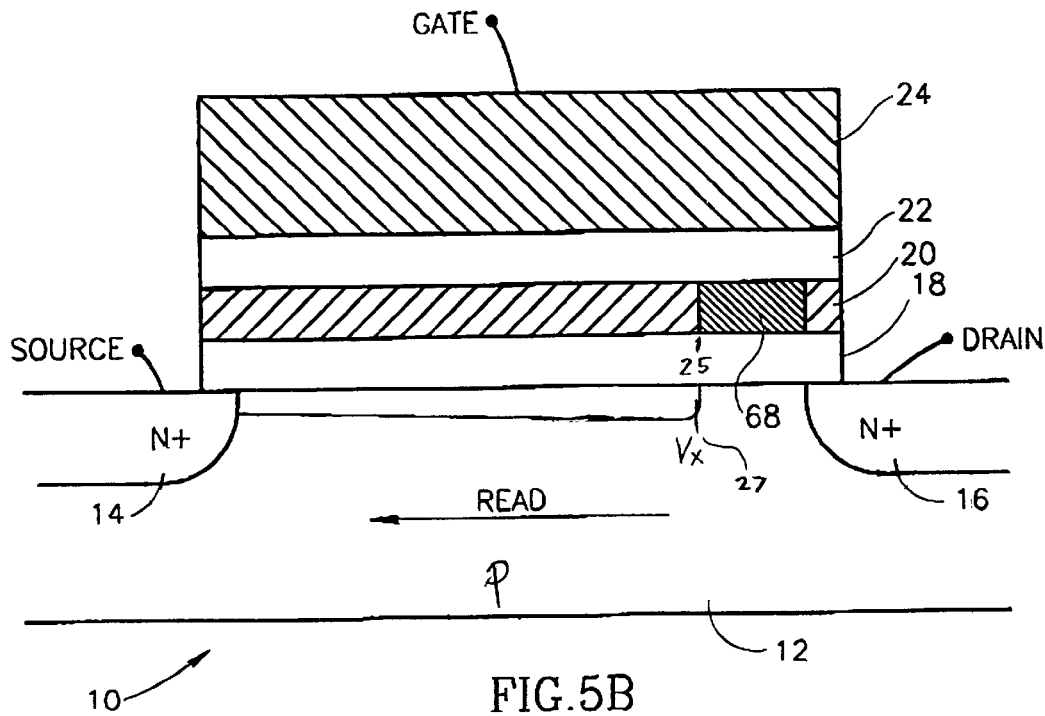
FIG. 5B illustrates a sectional view of a flash EEPROM cell constructed in accordance with an embodiment of the present invention showing the area of charge trapping under the gate.

As stated above, the time needed to program the flash EEPROM memory cell greatly increases when reading occurs in the same direction (i.e., the forward direction) as programming. The reason for this will now be explained in more detail with reference to FIGS. 5A and 5B. FIG. 5A illustrates a sectional view of a flash EEPROM cell of the prior art showing the area 66 of charge trapping under the gate 42. FIG. 5B illustrates a sectional view of a flash EEPROM cell constructed in accordance with an embodiment of the present invention showing the area 68 of charge trapping under the gate 24 for the right bit.

A description of what occurs during programming is presented first followed by what occurs during reading. Note that the description that follows also pertains to the memory cell of FIG. 3 comprising the silicon dioxide layer 54 having buried polysilicon islands 57 substituting for the nitride layer 20 of FIG. 2. During programming, hot electrons are injected into the nitride layer 20, as described above. Since the nitride 20 is a nonconductor, the trapped charge remains localized to the region near the drain 34 (FIG. 5A) or 16 (FIG. 5B). The region of trapped charge is indicated by the cross hatched area 66 in FIG. 5A and by the cross hatched area 68 in FIG. 5B. Thus, the threshold voltage rises, for example, to approximately 4 V, only in the portion of the channel under the trapped charge. The threshold voltage of the remainder of the channel under the gate remains at, for example, approximately 1 V. If the device is now read in the conventional forward direction (i.e., voltages are applied to the gate and drain as indicated by the arrow in FIG. 5A), electrons move off the source and begin traveling toward the drain. When a logic '0' is programmed, there can be little or no channel current through the device when it is read. Thus, only if a sufficient portion of the channel is turned off, can the electron current be stopped. If the channel cannot be completely turned off, the electrons will reach the drain. Whether the electrons reach the drain will be determined by, among other things, the length of the trapping area. If the memory cell is programmed for a sufficiently long period, eventually, the channel stops conducting when read in the forward direction. If the trapped charge region (the programmed area) 66 (FIG. 5A) is not long enough, electrons can punch through to the drain 34 in the depletion region under the trapped charge 66.

When the device is read in the forward direction, a voltage is applied to the drain and the gate, for example 2V and 3V, respectively, and the source is grounded. Full inversion occurs in the channel under the area of the nitride 38 that does not have trapped charge. A vertical electric field exists in the channel that spans the length of the channel up to the region of the channel underneath the trapped charge 66. In the inversion region, electrons travel in a linear fashion up to the edge 35 of the inversion region which is beneath the left edge 35 of the trapped charge region 66. This is indicated by the line shown in the channel region in FIG. 5A that extends from the source to just beneath the edge 33 of the region of trapped charge 66. Due to the fact that the device is in inversion (i.e., the channel is in a conductive state), the potential in the inversion layer is pinned to ground potential because the source is grounded. The voltage in the inverted channel near the trapped charge (i.e., just to the left of the right edge 35 of the channel inversion region) is approximately zero. Thus, the voltage across the region of trapped charge is close to the full drain potential of 2 V. Due to the drain potential across the channel region beneath the trapped charge 66 some of the electrons punch through across the trapped region to the drain, resulting in a channel current.

The diagonal line under the channel in FIGS. 2 and 5A indicate the reduction in the number of electrons in the channel as a function of channel distance. The channel region under the trapped charge is off (i.e., not inverted) due to the high threshold voltage required to invert this region under the trapped charge. However, the channel region inside the dashed circle 23 in FIG. 2 and under the region 66 in FIG. 5A is a depletion region because the device is in saturation (a device will be in saturation when VDS, the voltage from drain to source, is higher than VDSAT, the saturation voltage). Due to the voltage on the drain 34, a lateral electric field exists in this portion of the channel under region 66. As a result of this lateral electric field, any electron arriving at the edge of the depletion region will be swept through and pulled to the drain 34. As described earlier, this phenomenon is called punch through. Punch through occurs if the lateral electric field is strong enough to draw electrons through to the drain, regardless of the threshold level. In order to prevent punch through from occurring during a read, the prior art memory cells require a much longer programming time than does the memory cell of this invention because the prior art memory cells are read in the forward direction. As the memory device is programmed for a longer and longer time, more and more electrons are injected into the nitride, increasing the length of the programmed portion 66 (FIG. 5A) of the channel. The memory cell must be programmed for an amount of time that yields a trapped charge region 66 of sufficient length to eliminate the punch through of electrons. When this occurs, the lateral electric field is too weak for electrons to punch through to the drain under normal operating conditions. As an example, for the threshold voltage equaling 3V during read in the forward direction, FIG. 4 shows that at a programming time of approximately 3 milliseconds is required.

Reading in the Reverse Direction

However, if the flash EEPROM memory cell 10 (FIG. 5B) is read in the reverse direction, a very different scenario exists. Reading in the reverse direction means reading in a direction opposite to that of programming. In other words, voltages are applied to the source 14 and the gate 24 and the drain 16 is grounded. Similar to the prior art memory device of FIG. 5A, the memory device of FIG. 5B is programmed in the forward direction by injecting hot electrons into region 68 of the nitride layer 20. Since nitride 20 is a nonconductor, the trapped charge remains localized to the region near the drain, for the right bit, for example. The left bit is similar except that source and drain functionality are reversed. The region of trapped charge is indicated by the cross hatched area 68 in FIG. 5B. Thus, the threshold voltage rises, for example, to approximately 4V only in the portion of the channel under the trapped charge 68. The threshold voltage of the remainder of the channel remains at, for example, approximately 1 V.

To read the right bit of the device of FIG. 5B in the reverse direction, a voltage is applied to the source 14 and the gate 24, for example 2V and 3V, respectively, and the drain 16 is grounded. A major difference between reading in the forward direction and reading in the reverse direction is that when reading in the reverse direction, the gate voltage required to put the channel of the memory device into inversion increases significantly. For the same applied gate voltage of 3V, for example, there will be no inversion but rather the channel of the memory device will be in depletion. The reason for this is that the channel region next to the drain 16 (which functions as the source in read) is not inverted due to the electron charge in region 68 of the nitride 20. The channel adjacent the source 14 (which functions as the drain in read) is not inverted because 2V is applied to the source 14 and the channel, to be inverted, must be inverted relative to 2 V. In the case of reading in the reverse direction, in order to sustain a higher voltage in the channel, a much wider depletion region must be sustained. A wider depletion region translates to more fixed charge that must be compensated for before there can be inversion. When reading in the reverse direction in accordance with the present invention, to achieve a voltage drop across the charge trapping region 66 of the prior art memory device shown in FIG. 5A similar to the voltage drop achieved when reading the same device in the forward direction, a higher gate voltage is required, for example, 4 V. This is in contrast to the prior art memory device where the source was grounded and a lower gate voltage was required to invert the channel. In the memory device of the present invention, a much higher gate voltage is required to pin the voltage in the channel to a higher voltage, i.e., the 2V that is applied to the source terminal rather than ground. In other words, the present invention recognizes and takes advantage of the fact that for the same magnitude potential across the drain and the source, the voltage across the portion of the channel under the trapped charge region 68 (FIG. 5B) is significantly reduced when reading occurs in a reverse direction to writing (programming), directly resulting in less punch through and greater impact of the programming charge injected in region 68 of the nitride layer 20 (FIG. 5B) on the threshold voltage of the transistor. As an example, for the threshold voltage $V_T$ equaling 3v during reverse read, FIG. 4 shows that a programming time of approximately 2 microseconds is required. This programming time is three orders of magnitude less than the programming time required for the same threshold voltage when the cell is read in the forward direction.

In the prior art, memory cells utilizing the ONO structure have had difficulty retaining the localized charge in the nitride layer. This is because such memory cells are programmed in a first forward direction and then read in the same direction. The reading of the programmed cell in the forward direction requires a significant amount of charge to be stored on the nitride to provide the desired increase in threshold voltage associated with the programmed cell. However, in accordance with this invention, by reading in the reverse direction, significantly less charge is required to be stored on the nitride to achieve the same increase in threshold voltage in a programmed cell. FIG. 4 shows the difference in charge (measured as a function of programming time required to achieve a given threshold voltage $V_T$) for reading in the reverse direction versus the forward direction. In the prior art, the charge retention in a localized region of the silicon nitride layer was difficult if not impossible to achieve because the lateral electric field generated by the charge dispersed the charge laterally in the nitride layer. Such dispersion particularly occurred during the high temperature retention bake required for quality control and reliability. The high temperature retention bake typically requires temperatures between 150 degrees Centigrade to 250 degrees Centigrade for at least 12 to 24 hours. The charge in the prior art devices typically dispersed through the nitride during the high temperature bake causing the performance of prior art devices using the nitride layer as a charge retention material to be less than satisfactory. Accordingly, prior art devices that use the nitride layer for charge retention are not widely used. In addition, charge stored on the nitride layer in prior art memory cells is particularly prone to lateral diffusion and dispersion through the nitride layer in response to the retention bake due to the internal fields causing what is known as electron hopping. The phenomenon of electron hopping is exponentially dependent on the field strength. In the case of charge in the nitride layer the internally generated electric field is directly related to the amount of charge stored on the nitride layer. Because electron hopping is exponentially dependent upon the electric field strength, the additional charge required to obtain a given threshold voltage change or shift when the memory cell is read in the same direction as it was programmed causes a very significant change in the charge distribution in the nitride layer. This change in the charge distribution seriously degrades the threshold voltage from the intended (i.e., design) threshold voltage. Consequently, prior art ONO devices have not been successful.

In accordance with the present invention, by reading the memory cell in the reverse direction from which the memory cell is programmed, the amount of charge required to achieve a given threshold voltage is reduced in some cases by a factor of two or three times the amount of charge required to obtain the same threshold voltage shift when the memory cell is read in the forward direction. Accordingly, the internal electric fields generated by the charge in the nitride when the memory cell is to be read in the reverse direction are much less than the internal electric fields associated with the charge stored on the nitride when the memory cell is to be read in the forward direction. Consequently electron hopping is exponentially reduced and the small amount of charge stored in the nitride does not disperse laterally through the nitride due to the internally self generated electric fields even during retention bake. Consequently, the memory cell of the present invention does not suffer the degradation in performance and reliability of prior art ONO memory cells which are programmed and read in the same direction.

Sample Flash EEPROM Device Data

Figure 6:
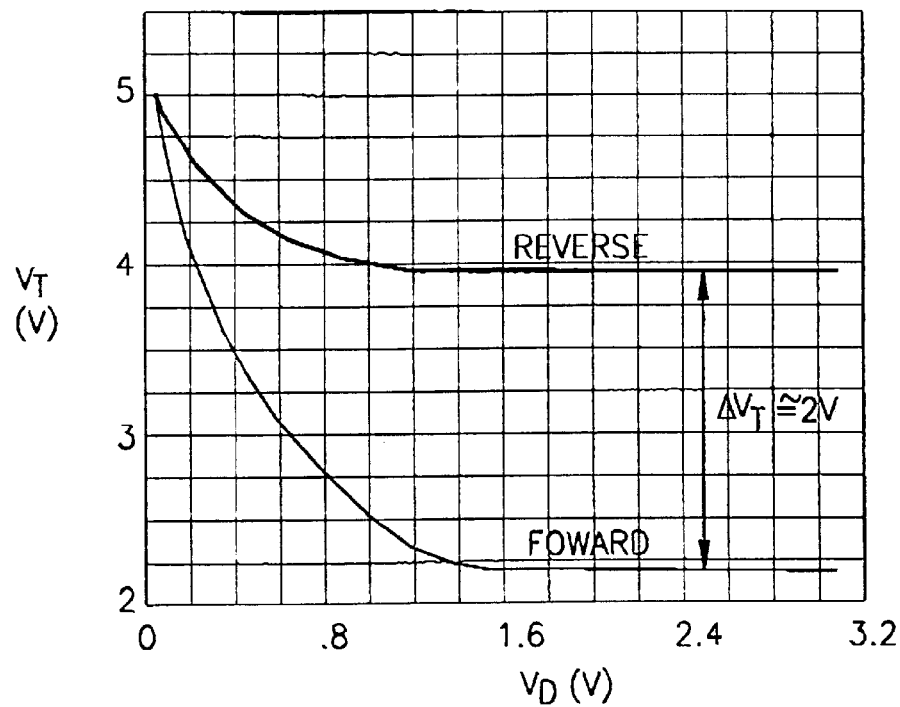
FIG. 6 is a graph illustrating the difference in threshold voltage in the forward and reverse directions as a function of drain voltage for a flash EEPROM cell of the present invention that has been programmed.

Data obtained from flash EEPROM devices constructed in accordance with the present invention will now be presented to help illustrate the principles of operation thereof. A graph illustrating the difference in threshold voltage in the forward and reverse directions as a function of drain voltage for a flash EEPROM cell of the present invention that has been previously programmed is shown in FIG. 6. The memory cell used to obtain the data presented in FIGS. 6, 7 and 8 was constructed with a bottom oxide layer 18, a top oxide 22 and a nitride layer 20, each 100 Angstroms thick. The drawn width of the channel measures 0.6 microns and the drawn length of the channel measures 0.65 microns.

While reading in the forward direction, the threshold voltage is approximately the same as the threshold voltage when reading in the reverse direction for low drain voltages. At low drain voltages there is insufficient potential for punch through to occur. However, as the drain voltage increases while reading in the forward direction, the punch through region increases resulting in lower threshold voltage. At a high enough drain voltage, the entire portion of the channel under the trapped charge in region 68 of nitride layer 20 (FIG. 5B) is punched through and the threshold voltage levels off at the original threshold voltage of the channel.

However, while reading in the reverse direction, the $V_T$ versus $V_D$ curve appears to follow the $V_T$ versus $V_D$ curve while reading in the forward direction at low drain voltages. However, the curves rapidly diverge for higher drain voltages and the threshold voltage for reading in the reverse direction levels off at approximately 4V. At a gate voltage $V_G$ of approximately 4V and a drain voltage $V_D$ Of 1.2V, the device has reached saturation ($V_D$ SAT). At this gate voltage, any further increase in $V_D$ cannot be transferred through the inversion layer thus establishing the maximum potential drop across the portion of the channel beneath the charge trapping region 68. The $V_T$ then becomes independent of further increases in $V_D$. For example, at a drain voltage of 1.6V, the difference in $V_T$ between reverse and forward read is almost 2V.

Figure 7:
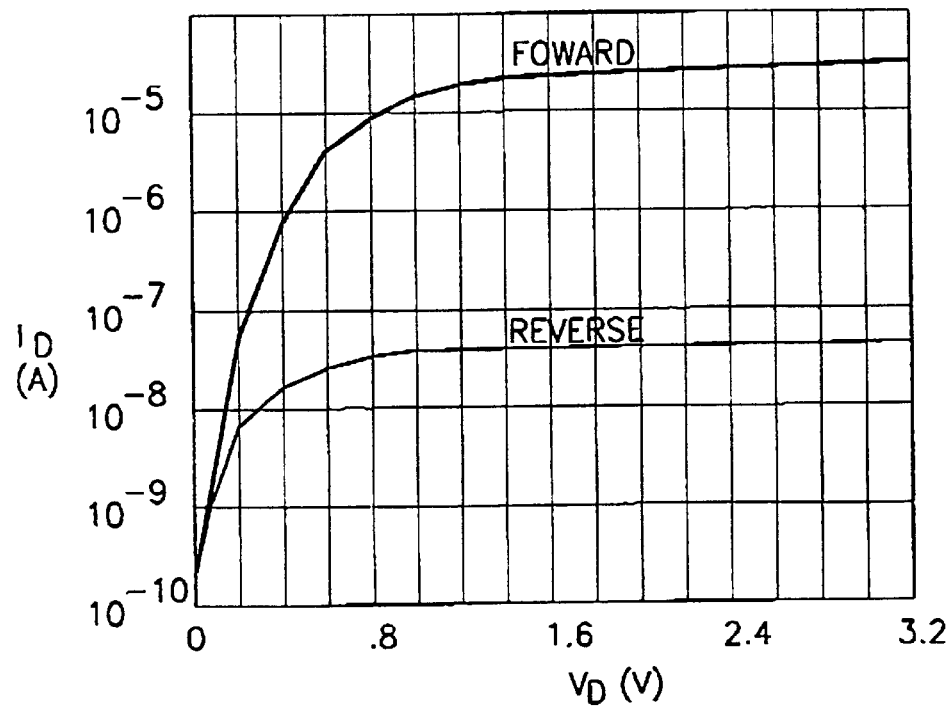
FIG. 7 is a graph illustrating the difference in drain current in the forward and reverse directions as a function of drain voltage for a flash EEPROM cell of the present invention that has been programmed.
Figure 8:
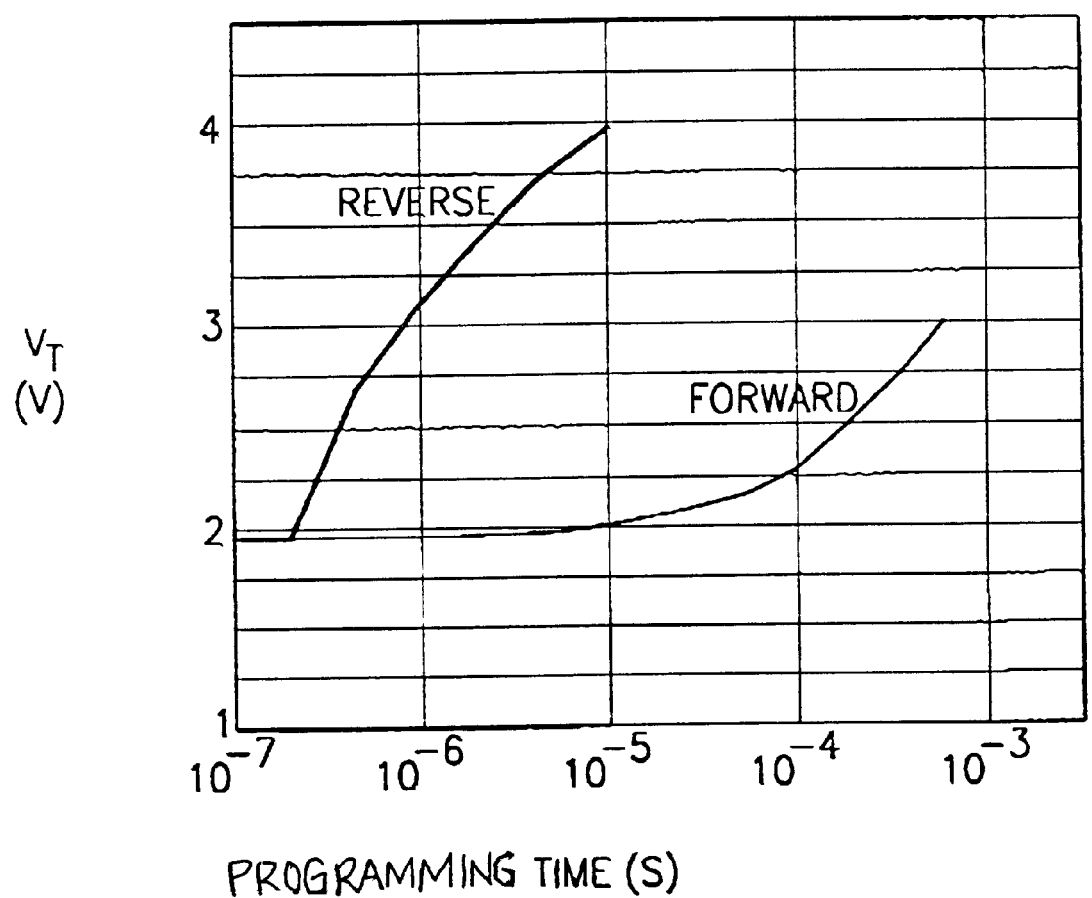
FIG. 8 is a graph illustrating the threshold voltage of a flash EEPROM cell of the present invention as a function of programming time for reading in the forward and reverse directions.

A graph illustrating the difference in drain current in the forward and reverse directions as a function of drain voltage for a flash EEPROM cell of the present invention that has been programmed is shown in FIG. 7. In FIG. 7, rather than measure threshold voltage, the drain current is measured while keeping the gate voltage constant. In the forward direction, as expected, the drain current $I_D$ increases as the drain voltage $V_D$ increases. The curve labeled FORWARD also resembles the $I_D$ curve for reading an unprogrammed cell in the reverse direction.

The drain current while reading in the reverse direction also increases with increasing drain voltage (measured at the source which functions as the drain when reading in the reverse direction) but the drain current levels off at a much lower current than when reading in the forward direction. The difference between drain currents at a $V_D$ of 2V is on the order of approximately 1000 times. If the logic threshold for this memory cell is set to 10 $\mu$A, the forward curve can represent a logic '0' and the reverse curve a logic '1'.

The Voltage $V_X$ in the Channel The voltage $V_X$ is defined as the voltage in the channel at a distance X from the source. Using the example presented above, the voltage $V_X$ that exists in the channel of the memory cell of the present invention (FIG. 5B, for example) will not be 2V because the device is in depletion rather than inversion. On the other hand, the voltage $V_X$ must be larger than 0 because a gate voltage of only 1.5V is able to sustain approximately 0.4V in the channel. The actual voltage in the channel varies across the channel length because of the lateral electric field set up between the source and the drain. The threshold voltage, however, varies as a function of the voltage in the channel.

With reference to FIG. 5B, the channel will be in saturation as long as the gate voltage $V_G$ is higher than the threshold voltage $V_T$ and the voltage $V_X$ at any point in the channel is given by $$V_X = V_{DSAT}$$

with $$V_{DSAT} = V_G - V_I = V_G - V_T \qquad (V_{DSAT})$$

and $$V_T(V_X) = V_{T0} + \Delta V_T(V_X)$$

As is shown in the above equations, the threshold voltage in the channel is equal to the threshold voltage with the source at zero potential $V_{T0}$ plus a delta threshold voltage $\Delta V_T$ which is itself a function of the voltage in the channel.

Figure 9:
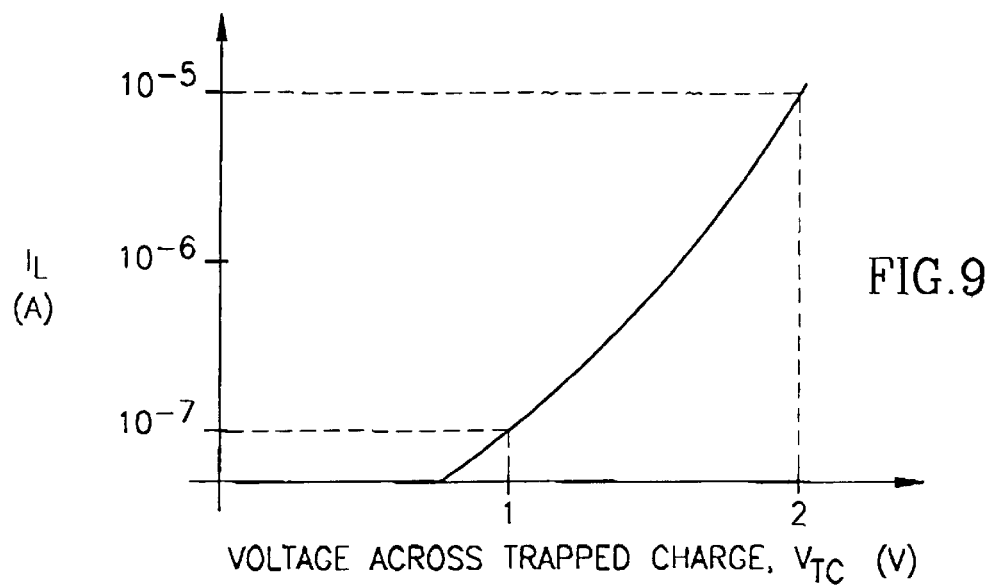
FIG. 9 is a graph illustrating the leakage current through the region of trapped charge as a function of the voltage across the charge trapping region while reading in the reverse direction.

The leakage current through the channel under the region 68 of trapped charge, plotted as a function of the voltage $V_{TC}$, across the portion of the channel under the charge trapping region 68 while reading in the reverse direction, is shown in FIG. 9. From the graph, one can see that the approximate leakage current $I_L$ through the channel when $V_{TC}$ is 2V is $10^{-5}$ A. In the case of the prior art memory cell read in the forward direction, the voltage across the portion of the channel under region 68 of trapped charge is approximately 2V. In contrast, the voltage $V_X$ in the channel of the memory device of the present invention at location 27 beneath the edge 25 of the region 68 of trapped charge is not 2V but something less, 1V for example. The leakage current $I_L$ corresponding to 1V across the trapped charge region is approximately $10^{-7}$ A, a whole two orders of magnitude smaller.

Of importance, the edge of the region of trapped charge formed in the nitride layer during programming is the portion of the trapped charge that begins to affect the gate voltage required to invert the channel beneath that point.

Figure 10:
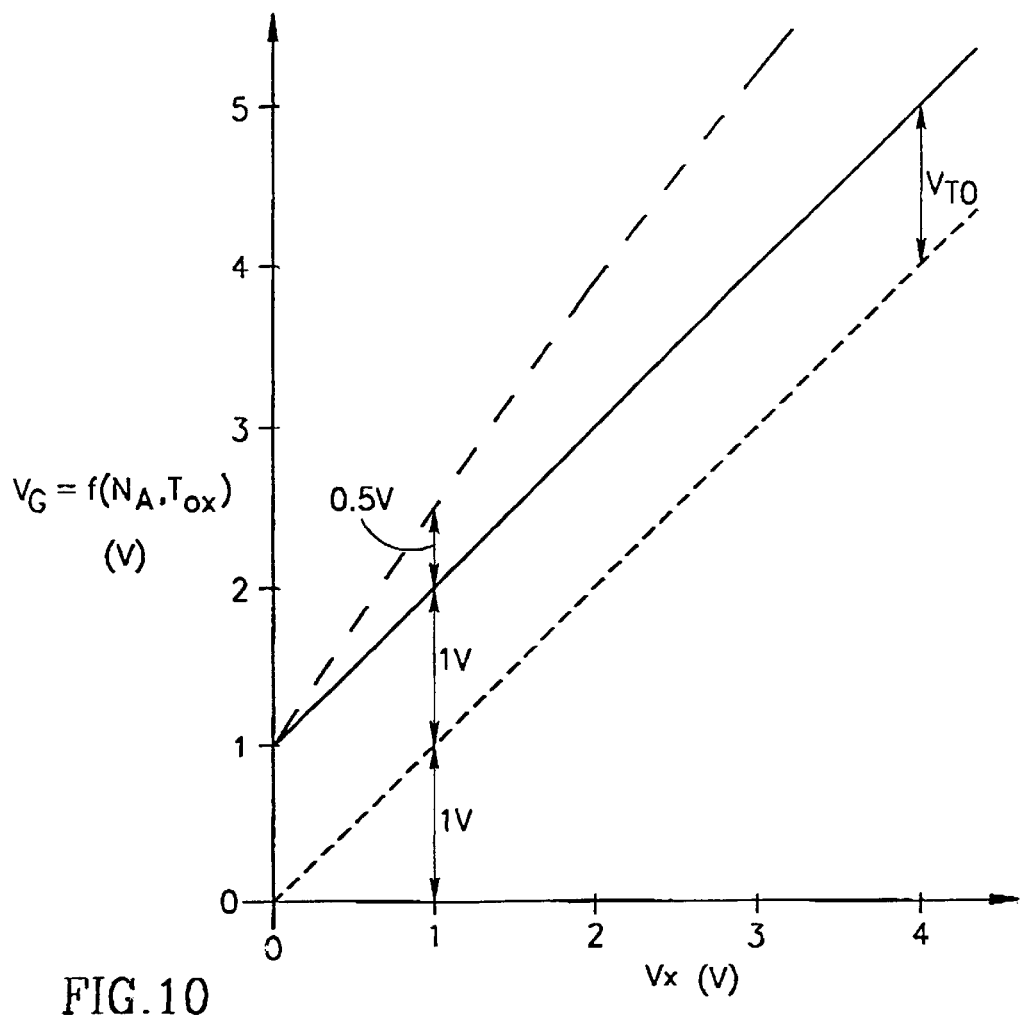
FIG. 10 is a graph illustrating the gate voltage required to sustain a given voltage in the channel beneath the edge of the region of trapped charge while reading in the reverse direction.

A graph illustrating the gate voltage required to sustain a given voltage in the channel, $V_X$, spanning the distance from the drain to the edge 27 of the channel under the edge 25 of the charge trapping area for one of the two bits while reading in the reverse direction is shown in FIG. 10. The gate voltage $V_G$ that is required to sustain a particular $V_X$ at the point 27 in the channel under the edge 25 of the charge trapping area 68 (FIG. 5B) is a function of the number of acceptors $N_A$ in the substrate and the thickness of the oxide $T_{OX}$ and is represented by the dashed/dotted line. The solid line represents the threshold voltage in the channel that exists when the back bias effect on the threshold voltage is zero. In this case, the threshold voltage is constant along the entire channel. However, once there is a voltage in the channel, the threshold voltage is not constant along the channel. As shown in the graph, the threshold voltage increases nonlinearly as the voltage in the channel increases. The relationship between the incremental increase in threshold voltage as a function of channel voltage is well known in the art. A more detailed discussion of this relationship can be found in Chapter 2 of "The Design and Analysis of VLSI Circuits" by L. A. Glasser and D. W. Dobberpuhl, incorporated herein by reference.

Figure 11:
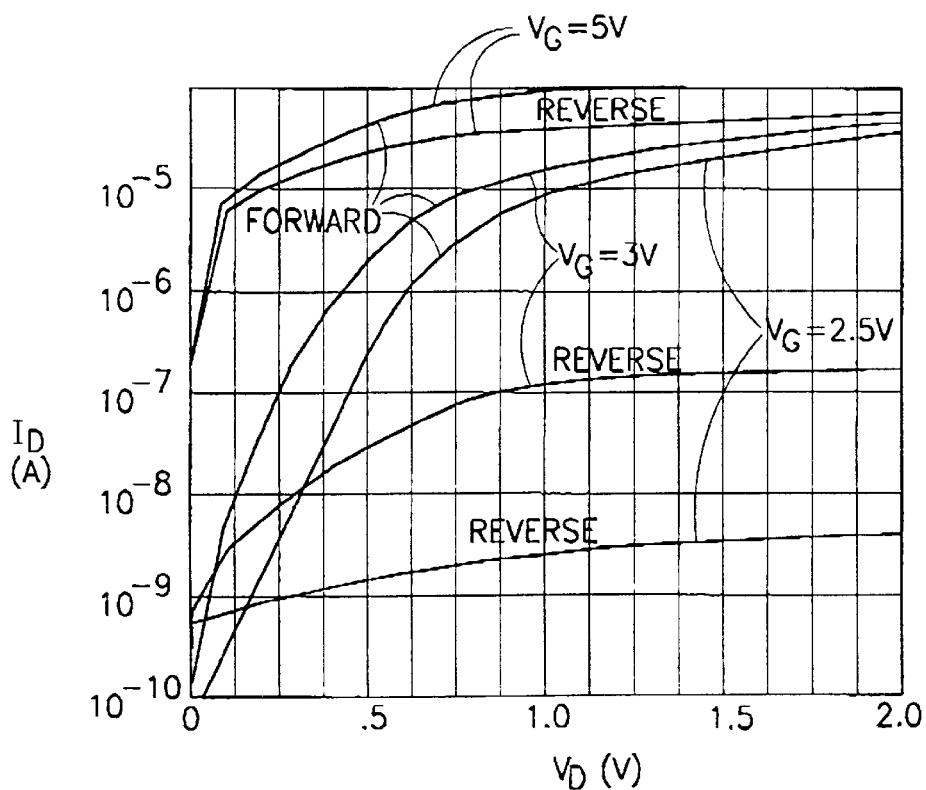
FIG. 11 is a graph illustrating the effect of the gate voltage applied during reading on the difference in drain current between reading in the forward versus the reverse direction.

It is important to emphasize that the advantages and benefits of reading in the reverse direction are achieved only when combined with the use of relatively low gate voltages. For a particular drain voltage, e.g., 2V, applying a high enough $V_G$ such as 5V, for example, causes the differences in threshold voltages between forward and reverse reading to fade. A graph illustrating the effect of the gate voltage $V_G$ applied during reading on the difference in drain current $I_D$ between reading in the forward direction versus reading in the reverse direction for one of the two bits is shown in FIG. 11. The reverse $V_T$ of the device used to generate the curves in the Figure is 3.5V. From FIG. 11 it can be seen that as $V_G$ is increased while $V_D$ is kept constant, the $I_D$ curves for the reverse read begin to resemble the curves for the forward read. For example, comparing the forward and reverse read curves when $V_G$ equals 2.5V shows the read current in the reverse direction being about four orders of magnitude lower. At a gate voltage $V_G$ of 3V, the difference in read current between the forward and reverse directions drops to a little more than two orders of magnitude. At a gate voltage of 5V, the difference in read current is only approximately 15%. These curves clearly show that large differences in $I_D$ between the forward and reverse read directions are only obtained when $V_G$ is chosen to be low enough. Thus, the benefits of reading in the reverse direction are only achieved when suitably low gate voltages are used for reading. There is an optimum range within which $V_G$ should lie. If $V_G$ is too low, insufficient current is developed in the channel. On the other hand, if $V_G$ is chosen too high, the differences between reading in the reverse and forward directions are greatly diminished.

Figure 12:
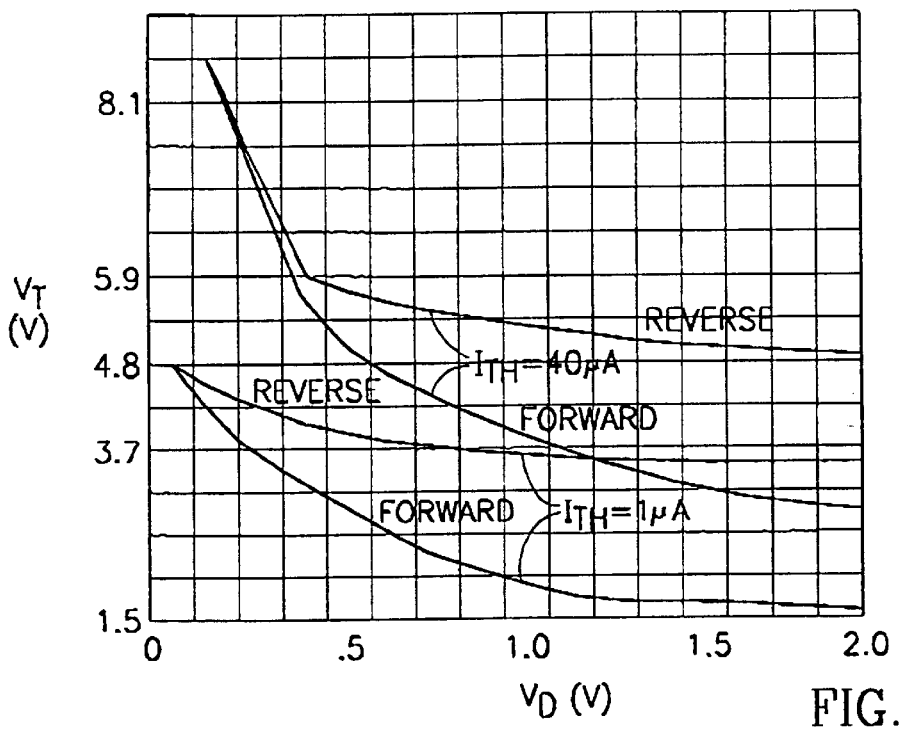
FIG. 12 is a graph illustrating the effect of the gate voltage (as measured by threshold channel current $I_{TH}$) on the difference in threshold voltage between the forward read and reverse read directions.

A graph illustrating the effect of the gate voltage on the difference in threshold voltage between the forward and reverse directions is shown in FIG. 12. The device used to generate the curves in FIG. 12 was programmed once to a $V_T$ of 3.5V using a $V_D$ of 1.6V and an $I_{TH}$ of 1 $\mu$A. The $V_T$ as a function of $V_D$ during reading was subsequently measured. As labeled in FIG. 12, the $I_{TH}$ level for the lower two curves is 1 $\mu$A, and is 40 $\mu$A for the upper two curves. The effect of raising the $I_{TH}$ is to force the $V_T$, measurement to be at a higher $V_G$ level even though the amount of charge trapped in the silicon nitride layer is identical for all measurements. For the lower two curves ($I_{TH}$ of 1 $\mu$A) the forward and reverse threshold voltages start to separate from each other at a $V_D$ of approximately 50 mV while the $V_T$, for the reverse saturates at approximately 0.6 V. For the upper two curves ($I_{TH}$ of 40 $\mu$A) the forward and reverse threshold voltages start to separate from each other at a $V_D$ of approximately 50 mV while the $V_T$, for the reverse saturates at approximately 0.6V. For the upper two curves ($I_{TH}$ of 40 $\mu$A) the forward and reverse threshold voltages start to separate from each other at a $V_D$ of approximately 0.35V while the $V_T$ for the reverse saturates at approximately 1.35V. Thus, these curves clearly show that the effect of the trapped charge depends heavily on the choice of $V_G$.

Programming the Two Bit Cell

With reference to FIG. 2, programming the two bit EEPROM cell of the present invention will now be described. In programming the two bit cell, each bit, i.e., the left and right bit, is treated as if the device was a single bit device. In other words, both the left and right bits are programmed as described in the section entitled "Programming One Bit in the Forward Direction." For the right bit, for example, programming voltages are applied to the gate 24 and drain 16 and hot electrons are injected into and trapped in the charge trapping layer 20 in the region near the drain defined by the dashed circle 23. Correspondingly, the threshold voltage of the portion of the channel under the trapped charge increases as more and more electrons are injected into the nitride layer. The programming of the right bit is represented in FIG. 2 by the right-pointing arrow labeled 'PROGRAM.' This arrow represents the flow of electrons to the right during programming of the right bit.

Similarly, the left bit is programmed by applying programming voltages to the gate 24 and source 14, which now functions as the drain for the left bit. Hot electrons are injected into and trapped in the charge trapping layer 20 in the region defined by the dashed circle 21. The threshold voltage of the portion of the channel under the trapped charge comprising the left bit increases as more and more electrons are injected into the nitride layer. The programming of the left bit is represented in FIG. 2 by the left-pointing arrow labeled 'PROGRAM.' This arrow represents the flow of electrons to the left during programming of the left bit.

A graph illustrating the effect programming one of the bits has on the other bit which has not been previously programmed is shown in FIG. 13. In this particular example, the right bit is shown being programmed while the left bit is read. The threshold voltage $V_T$ for the right bit assumes that the right bit is read in the reverse direction to the programming direction. Thus the threshold voltage for a programmed left bit will be relatively low compared to the threshold voltage for the right bit and thus the state of the right bit can be read without interference from the left bit. It is clear from the curves that during programming of the right bit, the unprogrammed left bit remains unprogrammed. This graph also illustrates the read through of the programmed right bit in order to perform a read of the left bit.

A graph illustrating the effect programming one of the bits has on the other bit which has been previously programmed is shown in FIG. 14. This graph was generated in two passes. Each curve is labeled either PASS #1 or PASS #2. During the first pass, the right bit was programmed while reading the unprogrammed left bit, as shown by the curves labeled RIGHT BIT-PASS #1 and LEFT BIT-PASS #1. These curves are similar to the curves of FIG. 13. During the second pass, once the right bit is programmed, the left bit, previously unprogrammed, is now programmed. At the same time, the right bit is read. The second pass is represented by the curves RIGHT BIT-PASS #2 and LEFT BIT-PASS #2.

As shown in FIG. 14, during the first pass, the left bit remains unprogrammed during the programming of the right bit. Programming the right bit does not affect the unprogrammed left bit. During the second pass, the left bit is programmed and the right bit remains programmed and can still be read. The gate voltage during programming is sufficiently high (typically around 10V) that the programmed right bit does not interfere with the programming of the left bit except to increase somewhat the time required to reach a given threshold voltage relative to the time required to reach the same threshold voltage for the right bit when the right bit is programmed. The graph also shows that the right bit can be programmed during programming of the left bit. Further, the programming of the left bit does not disturb the programmed right bit. This is possible because program through (i.e. the programming of the one bit substantially without interference from the other bit when the other bit is programmed) and read through (i.e. the reading of one bit without interference from the other bit when the other bit is programmed) occurs through both the left and the right bits.

Program through and read through are possible due to the relatively low gate voltages required to turn on each programmed bit when read in the forward direction as occurs when the other bit is read in the reverse direction. Another way to look at this is that a narrow charge trapping region permits punch through to be more effective. Thus the small amount of charge 68 trapped on the right edge of charge trapping layer 20 (FIG. 15) and self-aligned with the junction between region 16 and the substrate 12 and a comparable amount of charge 70 trapped on the left edge of charge trapping layer 20 and self-aligned with the junction between region 14 and the substrate 12 cause a narrow charge trapping region to be formed at both the right side and the left side of charge trapping layer 20 which is easy to be punched through when the bit is read in the forward direction. Thus when left bit 70 (the charge trapping region 70 is referred to as a bit because the presence or absence of charge in region 70 would represent either a zero or a one) is read in the forward direction, bit 68 is being read in the reverse direction. The punch-through under charge trap region 70 is quite easily achieved with a low gate voltage thereby allowing the charge trapped in bit 68 to control the state of the signal read out of the device. Thus for equal amounts of charge trapped in regions 70 and 68, reading a bit in the reverse direction results in the opposite bit having no effect on the state of the signal being read.

Another reason that the bit not being programmed is not disturbed is that the programming voltage is not being applied to the drain for the bit previously programmed. When programming the other bit, the programming voltage is applied to the drain for the bit on the other side of the device.

As discussed earlier, the programming duration must be limited for each bit in order that the other bit can still be read. For example, in the case when the right bit is programmed, i.e., a logic '0', and the left bit is not programmed, i.e., a logic '1', if the right bit was programmed for too long a time then when the left bit is read, there may be insufficient current for the sense amps to detect a logic '1' because the channel is not sufficiently conductive. In other words, if the right bit is programmed too long, a left logic '1' bit becomes slower, i.e., takes longer to read due to lower channel current, or, in the worst case, may appear to be a logic '0' because the over-programmed right bit prevents the left bit from being read. Thus, a window exists in the programming time within which a logic '0' bit must fall. One of the variable parameters is the voltage that is applied to the functional drain region during read. As the drain voltage is increased, a longer programming time, i.e., longer area of trapped charge, is required in order to avoid punch through. Thus, a longer trapping region is equivalent to increasing the programming time. The upper limit of the programming time for the window is the programming time such that a forward read does not change the read current by more than a predetermined percentage compared to the read current for a reverse read. Preferably, the percentage change to the read current should be limited to 10%. This percentage, although not arbitrary, can be optimized according to the design goals of the chip designer. For example, a designer may wish to have three orders of magnitude margin between the threshold voltage of a forward read and the threshold for a reverse read. To achieve this, the gate voltage, drain voltage and implant level are all adjusted accordingly to determine a maximum programming time.

The effect of programming one of the bits is that both programming and reading for the second bit is slowed somewhat. The second bit can be programmed as long as the gate voltage during programming is higher than the threshold voltage of the channel with the first bit programmed and sufficient voltage is placed on the drain. The channel resistance, however, is raised due to the programming of the first bit. As long as programming parameters are tuned properly, the higher channel resistance does not prevent the second bit from being programmed and read. The higher channel resistance, however, does cause programming and reading of the second bit to take longer.

Reading the Two Bit Memory Cell

Figure 15:
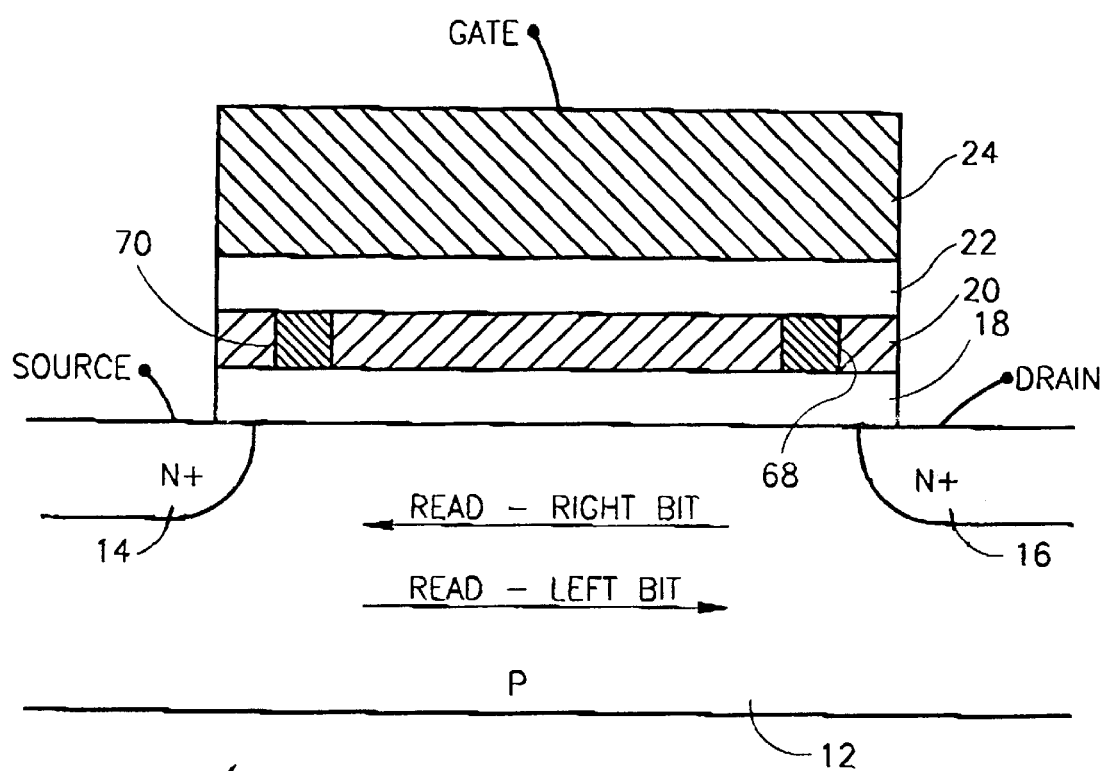
FIG. 15 is a sectional view of a two bit EEPROM cell constructed in accordance with an embodiment of the present invention showing the area of charge trapping under the gate for both the right and the left bits.

Reading the two bit EEPROM cell of the present invention will now be described. In reading the two bit cell, as in programming, each bit is treated as if the device was a single bit device. A sectional view of a two bit EEPROM cell constructed in accordance with a preferred embodiment of the present invention showing the area of charge trapping under the gate for both the right and the left bits is shown in FIG. 15. The area of trapping for the right bit is referenced 68 and that of the left bit is referenced 70. Also shown in FIG. 15 are two arrows labeled 'READ', one pointed in the left direction indicating the direction for reading of the right bit and one pointed in the right direction indicating the direction for reading of the left bit.

As described in the section entitled "Reading in the Reverse Direction" the right bit is read in the reverse direction by applying read voltages to the source 14 and the gate 24 and grounding the drain 16. For example, a gate voltage of 3V and a source voltage of 2V is applied. The resulting voltage in the channel $V_X$ will be something less than two volts in accordance with the graph in FIG. 10 and as described in detail above. Similarly, to read the left bit in the reverse direction, read voltages are applied to the gate 24 and to the drain 16 and the source 14 is grounded, e.g., 3V on the gate and 2V on the drain.

Figure 16:
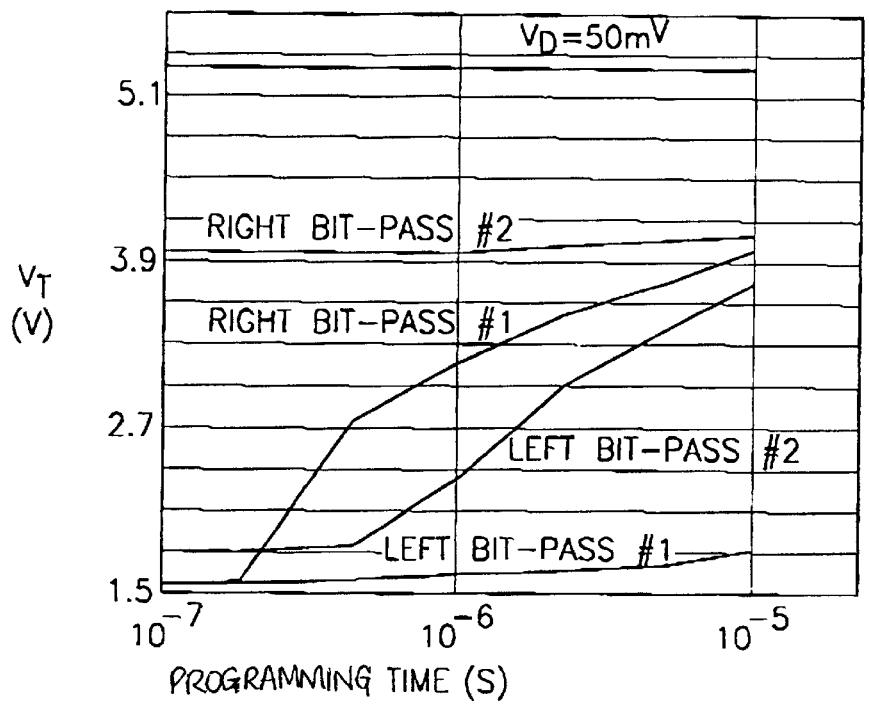
FIG. 16 is a graph illustrating the effect of a low drain voltage on the read through of a programmed bit.

A graph illustrating the effect of a low drain voltage on the read through of a programmed bit is shown in FIG. 16. This graph is similar to that of FIG. 14 with the addition of the top two curves above 5.1V. The four lower curves were generated using a $V_D$ of 1.6V. The two upper curves were generated by reading the unprogrammed bit after the other bit was programmed using a $V_D$ of 50 mV. These curves show that if $V_D$ is made too low and the first bit is programmed, insufficient voltage exists in the channel for read through to occur. They also show that the second bit to be programmed, in this case the left bit, experiences slower programming due to the increased series resistance of the channel. Even if the second bit is unprogrammed, when the drain voltage is too low and the first bit is programmed, the second bit cannot be read properly. Insufficient voltage exists in order for punch through to occur. If punch though does not occur, the second bit looks as if it is programmed whether it really is or not.

Punch through is very sensitive to the length of the trapped charge region, such as regions 68 and 70 of the structure shown in FIG. 15. Should these regions be too wide or not self-aligned with the appropriate region 16 or 14 (depending on whether the charge represents the right bit 68 or the left bit 70), then punch through would not be able to be guaranteed to occur and this concept would not work. Thus, the self-alignment of the trapped charge to the junction between region 16 and the substrate (for the trapped charge 68) and region 14 and the substrate (for the trapped charge region 70) is crucial to the functioning of this invention.

A read of the two bit memory device of the present invention falls into one of three cases: (1) neither of the two bits are programmed (2) one of the bits is programmed and the other is not or (3) both of the bits are programmed. The first case does not require a read through. The second case requires reading through the programmed bit to read the unprogrammed bit. In this case the margin is the delta between reading a single bit in the forward direction versus the reverse direction. An example of the margin can be seen in FIGS. 6 and 7 which illustrate the difference in $V_T$ and read current between the forward and the reverse directions for a single bit.

The third case requires read through to read both programmed bits. Programming the second bit, in fact, improves the conditions for reading the first bit. This is so because the voltage in the channel is further reduced over the case of reading a single bit. This increases the read margins between programmed and unprogrammed bits.

It is important to note that although the EEPROM cell of the present invention stores two bits, support circuitry and concepts designed to work with single bit memory cells can still be used. For example, the sense amplifier circuitry needed for the two bit memory cell is basically no different than that for the single bit memory cell. In the single bit memory cell, the sense amplifier circuitry is required to distinguish between two states, the programmed and unprogrammed states. Likewise, in the two bit memory cell of the present invention, the sense amplifiers must also distinguish between only two states: programmed and unprogrammed. This is in direct contrast to the prior art approaches to multi-bit memory cells wherein multiple thresholds are used which require multiple current levels to be detected by the sense amps. Accurately detecting multiple current levels in a memory device is a complex and difficult task to accomplish. The memory cell of the present invention, however, requires that the sense amps only distinguish between two states as in the single bit memory cell.

In the case when one of the bits is unprogrammed, i.e., no charge injected into charge trapping layer for that bit, a read of the other bit will be unaffected by this unprogrammed bit. On the other hand, however, in the case when one bit is programmed, a read of the other bit will be affected by this other programmed bit to some extent. Depending on various process parameters, the programmed bit may cause the channel to be less conductive. However, as long as the channel is sufficiently conductive both bits can be still be programmed and read correctly. This is discussed in more detail in the section titled "Optimization Parameters" presented below.

With reference to FIG. 15, the two bit memory device of the present invention utilizes a punch through or read through technique to read one bit when the other bit is in a programmed state. In order to read, for example, the right bit 68, the read current must be able to read through or punch through the left bit 70, assuming that both the left bit and the right bit have been programmed. Thus, there is a limit on the length of the charge trapping region that can be programmed. The charge trapping region must be short enough to permit punch through of the bit not being read. If a bit is in the unprogrammed state, there is no constraint on the read current of the other bit from the unprogrammed bit.

It is important to note that when a semiconductor device is scaled, the channel lengths become shorter and short channel effects take hold. Thus, in the two bit memory cell, because each bit is stored in different areas of the transistor, short channel effects may become prevalent sooner than in the case of the single bit transistor. In order to retain the usable range of drain voltage, the two bit transistor may need to be scaled by a smaller factor.

Criteria Necessary For Two Bit Operation

A key concept associated with the two bit EEPROM memory cell of the present invention is that for the device to operate properly, both bits must be able to be written and read. If one of the bits is programmed, a reverse read on the programmed bit must sense a high $V_T$, i.e., a '0' and a reverse read on the unprogrammed bit must sense a low $V_T$, i.e., a '1'. Thus, a reverse read on the unprogrammed bit, which is equivalent to a forward read on the programmed bit, must punch through the region of trapped charge in order to generate a high enough read current. If this does not happen, the unprogrammed bit will not be able to be read as a '1', i.e., a conductive bit.

In order to achieve this goal, a sufficient margin is generated between reading in the forward and reverse directions. With reference to FIG. 11, in order to store two bits, there must be sufficient difference between forward read of one of the bits and reverse read of the other bit. In addition, the reverse read current for one of the bits when the other bit is and is not programmed should be sufficient to distinguish between the two bits. For example, in FIG. 11, for a gate voltage of 3V, punch through for reading in the reverse direction occurs at approximately 1V. Thus, a drain voltage of 1.6V creates a suitable safety margin ensuring that the second bit can be read when the first bit is programmed.

There are two parameters that can be used to ensure punch through of the charge trapping region. The first is the $V_G$, applied during reading and the second is the width of the charge trapping region. A low $V_G$ used during reading combined with a narrow charge trapping region makes punch through more effective. The lower gate voltage produces a weaker vertical electric field which causes the lateral electric field to be stronger.

It is more important to use a low $V_G$ during reading in the two bit memory cell than in the single bit memory cell. In the single bit case, it only had to be ensured that the reverse read was better than the forward read, meaning that the $V_T$ of a given bit during forward reading was lower than the $V_T$ of this bit during reverse reading. In the two bit case, however, it is not enough that the $V_T$ drops in the forward case, it must drop sufficiently to be able to punch through when reading the other bit. If the delta $V_T$ between the forward and reverse read is not sufficient, one bit cannot be read when the other bit is programmed.

Erasing Prior Art Memory Devices

As discussed previously in connection with U.S. Pat. No. 4,173,766, issued to Hayes, a major disadvantage of the Hayes prior art insulated gate device is the difficulty in using the Hayes device to construct a flash EEPROM. A consequence of using an oxide-nitride structure as opposed to an oxide-nitride-oxide structure is that during programming the charge gets distributed across the entire nitride layer. The absence of the top oxide layer lowers the ability to control where the charge is stored in the nitride layer and allows holes from the gate to neutralize charge in the nitride layer. A thick nitride layer is required in order to generate sufficient charge retention in the device. However, the relatively thick nitride layer causes the charge trapping region to be very wide thus making erasing the cell difficult if not impossible. Thus there is a tradeoff between charge retention and sufficiently large threshold voltage deltas on the one hand and the ability to erase the device on the other hand.

Some of the prior art devices that use hot electron programming utilize an erase mechanism whereby the electrons previously trapped in the nitride are neutralized (i.e., erased) by transferring holes into the nitride. The information is erased by grounding the gate and applying a sufficient potential to the drain to cause avalanche breakdown. Avalanche breakdown involves hot hole injection and requires relatively high voltages on the drain for the phenomenon to occur. The hot holes are generated and caused to jump over the hole potential barrier of the bottom oxide between the channel and the nitride and recombine with the electrons in the nitride. This mechanism, however, is very complex and it is difficult to construct memory devices that work in this manner. Another disadvantage of using hot hole injection for erasing is that since the drain/substrate junction is in breakdown, very large currents are generated that are difficult to control. Further, the number of program/erase cycles that the memory cell can sustain is limited because the breakdown damages the junction area. The damage is caused by very high local temperatures generated in the vicinity of the junction when it is in breakdown.

Erasing the Two Bit Memory Cell

The erase mechanism of the two bit flash EEPROM memory cell 10 (FIG. 15) will now be described in more detail. The mechanism used to erase the two bit flash EEPROM memory cell of the present invention involves the movement of electrons as opposed to the movement of holes. For the right bit, an erase is performed by removing electrons from the charge trapping nitride region 68 either through the gate 24 via the top oxide 22 or through the drain 16 via the bottom oxide 18. For the left bit, an erase is performed by removing electrons from the charge trapping nitride region 70 either through the gate 24 via the top oxide 22 or through the source 14 via the bottom oxide 18.

Using the right bit as an example, one technique of erasing is to simultaneously apply a negative potential to the gate 24 and a positive potential to the drain 16 such that electron tunneling occurs from the charge trapping nitride layer 20 to the drain 16 via the bottom oxide 18. The left bit is erased in a similar fashion except that a positive potential is applied to the source 14 rather than the drain 16. The electron tunneling is substantially confined to a local area near the drain 16. To facilitate the erasing of the memory cell 10 using this technique, the thickness of the bottom oxide layer 18 is suitably constructed (i.e., has a thickness of about seventy (70) Angstroms) to optimize the removal of electrons from the nitride charge trapping layer 20 into the drain 16.

Using the right bit as an example, a second well known technique is to simultaneously apply a positive voltage potential to the gate 24 and zero potential, i.e., ground, to the drain 16 such that electron tunneling occurs from the charge trapping nitride layer 20 through the top oxide 22 to the gate 24. The right bit is erased in a similar fashion with zero potential applied to the source 14. In this case, the top oxide 22 is suitably constructed (again with a thickness of about seventy (70) Angstroms) to optimize the tunneling of electrons from the nitride charge trapping layer 20 into the gate 24 in order to facilitate the erasing of the memory cell 10. In one embodiment, the top oxide 22 has a thickness of 50 Angstroms to 80 Angstroms for a voltage on gate 24 of 10 to 18 volts.

Figure 17:
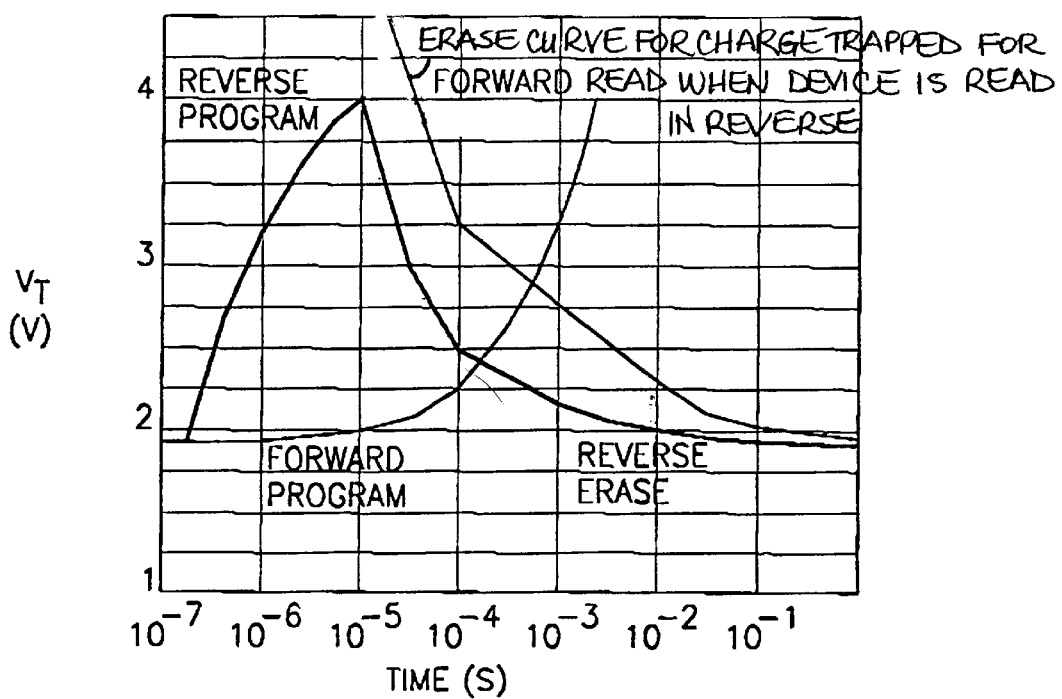
FIG. 17 is a graph illustrating the effect of programming on erase for the forward and reverse directions.

A graph illustrating the effect of programming on erase time for reading in the forward and reverse directions is shown in FIG. 17. FIG. 17 shows the times necessary to program the device to a threshold voltage of four (4) volts for reading in both the reverse ($10^{-5}$ seconds) and forward ($3\times10^{-3}$ seconds) directions. The graph presented in FIG. 17 is based on data obtained from a memory cell constructed in accordance with the present invention. In the first pass, the device was programmed to be read in the reverse direction and then erased. In the second pass, the device was programmed to be read in the forward direction and then erased. The erase processes for the charges associated with reverse read and forward read used the same drain voltage and gate voltage, namely a $V_D$ of 5.5V and a $V_G$ of $-8$V. The thickness of the top oxide, bottom oxide and nitride layers are all 100 Angstroms. Programming for forward reading and reverse reading utilized a $V_D$ of 5.5V and $V_G$ of 10V. Only the programming times differed. The forward and reverse programming curves are identical to those illustrated in the graph of FIG. 8.

As can be seen from FIG. 17, even when the device is programmed to the same threshold voltage, the time to complete the reverse erase is much less than the time to complete the forward erase. The forward erase (i.e. the time to remove the trapped charge associated with a given threshold voltage when the device is read in the forward direction) is slower than the reverse erase (i.e. the time to remove the trapped charge associated with a given threshold voltage when the device is read in the reverse direction). In addition, there is residual charge left in the charge trapping region as shown in the small gap between the reverse and forward erase curves at the one (1) second mark. This is due to the larger wider charge trapping region formed during the forward programming that was required to generate a threshold voltage of 4V. From the curves, the forward erase is approximately an order of magnitude slower than the reverse erase. The abrupt increase in threshold voltage for the curve labeled 'ERASE Curve for Change Trapped for Forward Read When Devive Is Read In Revese', is due to the reverse read used to measure the threshold voltage. For the same amount of charge trapping, the equivalent threshold voltage for reverse reading is much higher than that for forward reading. As can be seen in FIG. 17, the slopes of the forward and reverse erase curves are different. Reading in the reverse direction requires trapped charge so much smaller than does reading in the forward direction that the erase of the trapped charge is approximately 10 to 20 times faster. Also apparent from FIG. 17 is that the cell does not enter deep depletion. Even at the 1 second erase mark, the threshold voltage (about 2v) is no lower than that of an unprogrammed cell. This is a huge advantage of the memory cell of the present invention over prior art memory cells especially floating gate cells where over-erase can cause a failure of the memory array due to deep depletion of the charge on the floating gate.

Figure 18:
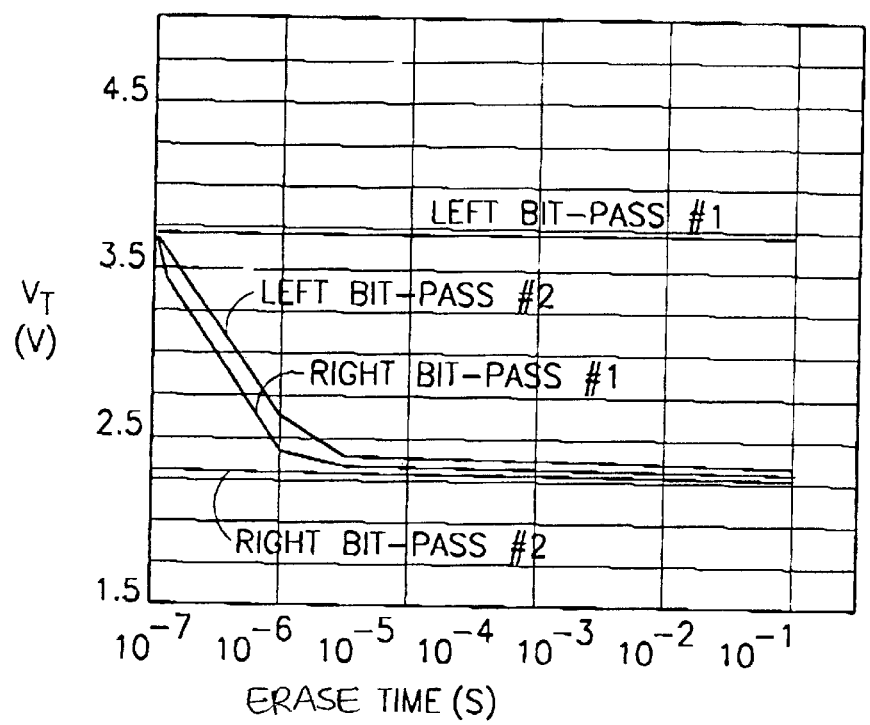
FIG. 18 is a graph illustrating the separate bit erase capability of the two bit EEPROM memory cell of the present invention.

The erase mechanism in the memory cell is self limiting due to the fact that as the memory cell is erased, more and more positive charge is stored in the trapping region 68 (FIG. 15) (for the right bit) of the nitride layer thereby neutralizing the negative charge stored there while the remainder of the nitride layer 20 remains unaffected. Thus, the threshold voltage of the channel keeps dropping until it levels off at the threshold voltage of an unprogrammed memory cell which is the threshold voltage of the larger majority of the channel closer to the source. Over-erasing the memory cell of the present invention only affects (i.e., lowers) the threshold voltage of the portion of the channel under the charge trapping region 68 which is a relatively narrow region while leaving the threshold voltage of the remainder of the channel at its normal value. A graph illustrating the separate bit erase capability of the two bit EEPROM memory cell of the present invention is shown in FIG. 18. The graph was generated in two passes and initially, both the right and the left bit are programmed each with an amount of trapped charge to achieve a given threshold voltage when read in the reverse direction. During the first pass, the right bit was erased while the left bit was read, as represented by the curves labeled RIGHT BIT-PASS #1 and LEFT BIT-PASS #1. During the second pass, the left bit was erased while the right bit was read, as represented by the curves labeled RIGHT BIT-PASS #2 and LEFT BIT-PASS #2. The graph shows that erasing of one of the bits does not affect the other bit. This is due to the fact that the erase voltage is localized to the junction adjacent to the bit that is to be erased. The difference in location between the curve labeled "Left Bit-Pass #2" and the curve labeled "Right Bit-Pass #1" is of no significance being well within the tolerance of the measurements.

Figure 19:
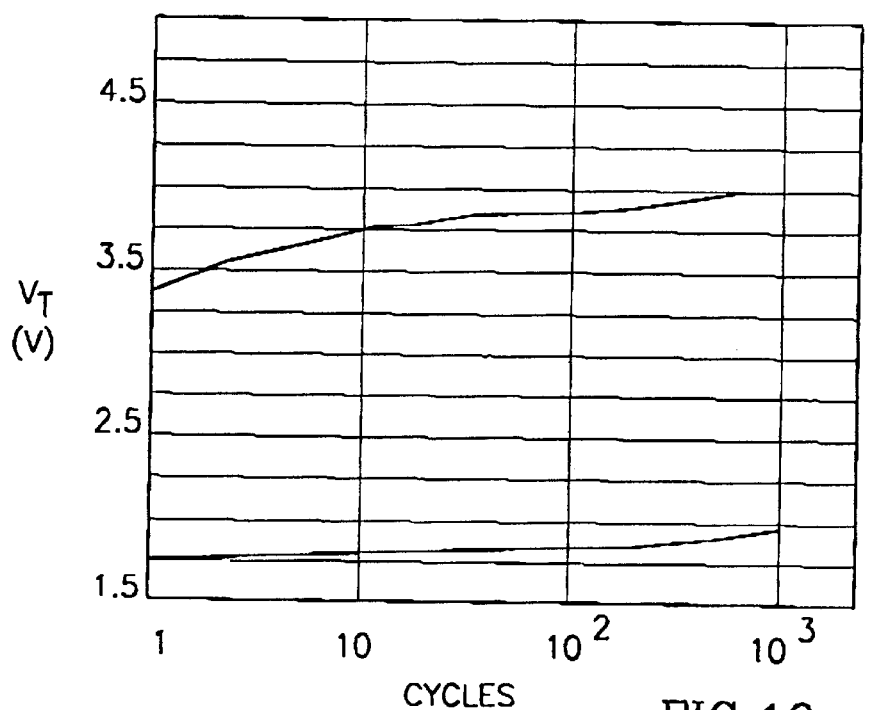
FIG. 19 is a graph illustrating the effect of cycling on the program and erase ability of the two bit EEPROM cell of the present invention.

A graph illustrating the effect of cycling on the program and erase ability of the two bit EEPROM cell of the present invention is shown in FIG. 19. The graph shows the $V_T$ of a bit associated with a given amount of trapped charge for reading in the reverse direction (top line) and the forward direction (bottom line). The gradual increase in threshold voltage $V_T$ for reading in both the forward and reverse directions reflects the lack of complete erasure of all the stored charge during each erase such that the amount of trapped charge gradually increases with time after programming and erasing for 1000 cycles.

As explained previously, a result of reading in the reverse direction is that a narrower charge trapping region is required due to the higher efficiency of the reverse read. Since erasing is always performed through the effective drain region 16 (for trapped charge 68 and region 14 for trapped charge 70), less charge needs to be moved off the charge trapping layer 20 and directed through the drain 16 (charge 68) or effective drain 14 (charge 70). Thus, reading the memory cell 10 in the reverse direction enables much faster erase times. This makes the entire erase process much easier than in prior art memory devices. In the prior art memory device (i.e., forward programming/forward read), the charge trapping region 66 (FIG. 5A) was much bigger and wider to achieve the desired change in threshold voltage, thus making the erase process more difficult. To erase the cell 41, a larger amount of charge spread out over a wider trapping region 66 must be directed through the drain 34. The danger with this lies in that if the charge trapping region 66 becomes top wide, the cell 41 may never be able to be completely erased. The charge trapping region 66 may become too wide if the device is overprogrammed which is a real possibility when programming and reading in the forward direction.

Figure 20:
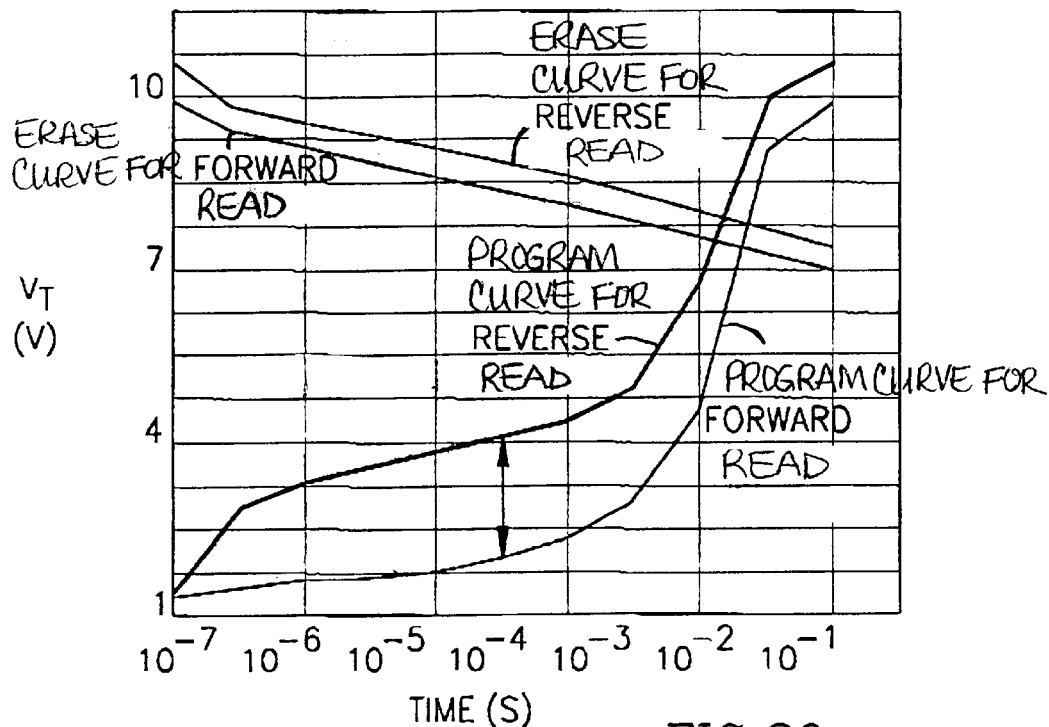
FIG. 20 is a graph illustrating the effect of over programming on the ability to erase for the forward and reverse directions.

A graph illustrating the effects associated with over programming on the ability to erase in the forward and reverse directions is shown in FIG. 20. The graph presented in FIG. 20 was constructed using data obtained from a memory cell 10 (FIGS. 5B and 15) constructed in accordance with the present invention. The top oxide 22 (FIG. 15), bottom oxide 18 and nitride layer 20 are each 100 Angstroms thick for a total ONO thickness of 300 Angstroms. Programming utilized a $V_D$ of 5.0V and $V_G$ Of 10V. Erasing utilized a $V_D$ of 5.0V and a $V_G$ of −8V. Note that programming and erasing are both in the forward direction. Reading, however, is either in the forward or reverse direction. It is the reverse direction read in conjunction with the careful control of the gate voltage to be within a selected range, that yields the advantages of this invention.

In this case, the memory cell, which has been programmed for 100 milliseconds, does not fully erase in a reasonable time (shown in FIG. 20 as 100 milliseconds) with $V_T$ being approximately 7V after 100 milliseconds of erase for reading in both the forward and reverse directions. The cell 10 cannot be erased because it has been over programmed, meaning the charge trapping region was made too wide to effectively erase. After 100 milliseconds of programming, the charge trapping region is very wide. The 13V ($V_D$ of 5V and $V_G$ of −8 v) that is applied across the charge trapping region 68 (FIG. 5B) to erase the trapped charge is effective in removing the electrons that are close to the drain 16. However, the electrons that are trapped further away from drain 16 towards the middle of the channel cannot be effectively removed because the electric field created by the 13V potential difference between the drain and the gate is much weaker at that point.

As is apparent from FIGS. 17 and 20, the slopes of the threshold voltage $V_T$ versus program time curves for forward read and reverse read (labeled "program curve for forward read" and "program curve for reverse read" in FIG. 20) are different. After approximately one millisecond, the forward program curve exhibits a higher slope than the reverse program curve. This shows that reading in the reverse direction is more tolerant to over programming than reading in the forward direction in the sense that a given uncertainty in programming time causes a bigger uncertainty in threshold voltage $V_T$ when reading in the forward direction than when reading in the reverse direction. When reading in the reverse direction, a $V_T$ of about 4V is reached after approximately 100 microseconds of programming. Even if programming continues up until a millisecond, a factor of 10X, the $V_T$ for reading in the reverse direction is only approximately 4.5V. For reading in the forward direction, a $V_T$ of 4V is reached only after approximately 7 milliseconds of programming. If programming is off by only 3X, the $V_T$ increases to approximately 8.3V. At this high $V_T$ it is not likely that the device can be erased.

Thus, it is important to stress that reading the memory device in the reverse direction does not just enable simpler and faster erasing, but in fact, if the device is to be read in the forward direction and the trapped charge is so adjusted to give the desired threshold voltage $V_T$, erasing is likely to be not possible at all. This is because much more charge must be trapped on the dielectric 20 beneath the gate 24 to achieve a usable difference in threshold voltage $V_T$ between the programmed and the unprogrammed state when reading in the forward direction than when reading in the reverse direction. This makes erasing the memory device at best difficult if not impossible thus making the forward programming/forward read impractical for this type of memory device which must be erasable.

The graph of FIG. 20 also illustrates the higher effectiveness during erase of the voltage on the drain versus the voltage on the gate. The gate voltage is not as effective due to the distance of the gate from the trapped charge which includes the thicknesses' of the top oxide 22 and the nitride layer 20. The drain voltage is more effective since it is more proximate to the region 68 of trapped charge. However, the gate voltage is more crucial when the width of the trapped charge region 68 is narrow. In this case, the gate voltage will be effective in creating an electric field that covers the entire charge trapping region 68 making the removal of electrons more efficient. The trapped charge region can only be made sufficiently narrow if the device is read in the reverse direction because only when the device is read in the reverse direction does a relatively small amount of charge stored on the dielectric under the gate yield a sufficiently larger difference in threshold voltage $V_T$ to allow the programmed state (i.e., charge stored on the gate) and the unprogrammed state (i.e., no charge stored on the gate) to be differentiated. As discussed previously, if the device is read in the forward direction, the charge trapping region must be made wide enough to generate a sufficient threshold voltage to differentiate between the programming and the unprogrammed states. Charge trapped far from the drain cannot be compensated for by lowering the voltage on the gate. In addition, the drain voltage cannot be increased beyond approximately 2V due to read disturb. The read disturb refers to slow programming of the bit during read. While the programming occurs very slowly, constantly reading the same cell over an extended period of time can cause programming of the bit to occur.

Figure 21:
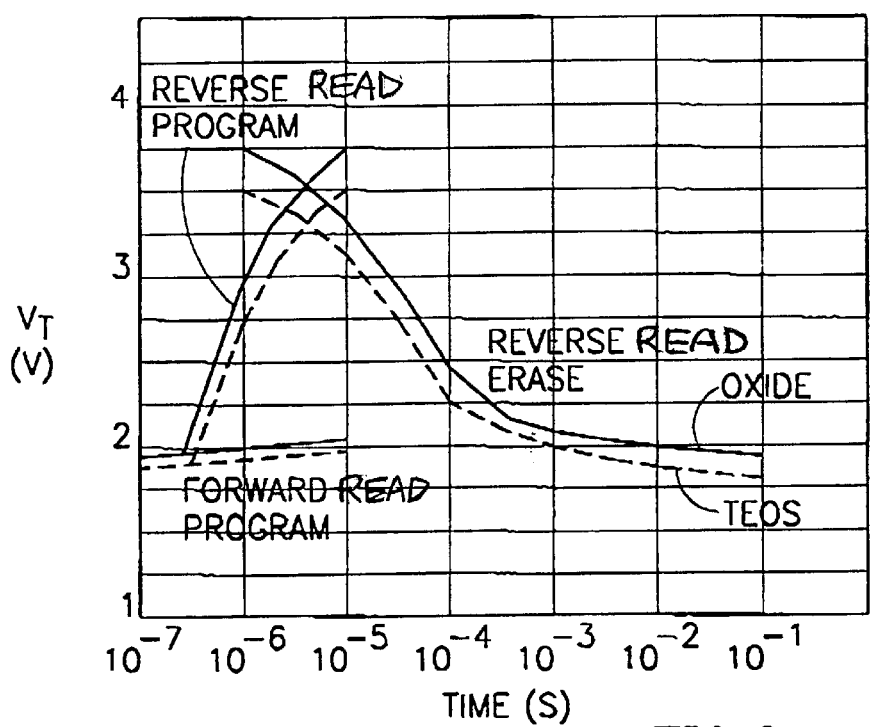
FIG. 21 is a graph illustrating the programming and erasing curves for using oxide versus TEOS as the material used as the top oxide.

A graph illustrating the programming and erasing curves representing the use of oxide versus TEOS as the dielectric on top of the nitride is shown in FIG. 21. The graph presented in FIG. 21 was constructed using data obtained from two memory cells constructed in accordance with the present invention, one memory cell using TEOS to form the oxide layer 22 (FIG. 15) on top of the nitride and the other memory cell using thermal oxidation of the nitride to form the top oxide layer 22. The thicknesses' of the top oxide layer 22, bottom oxide layer 18 and nitride layer 20 are 70, 100, 80 Angstroms, respectively. The width/length ratio for each memory cell channel is 0.6/0.65 microns. Programming (which is always done in the forward direction) utilized a $V_D$ of 5.0V and a $V_G$ Of 10V. Erasing (which is also always done in the forward direction) utilized a $V_D$ of 5.0V and a $V_G$ of −6V. This graph shows that there is little difference in the programming and erase characteristics when either oxide or TEOS is placed on top of the nitride.

Figure 22:
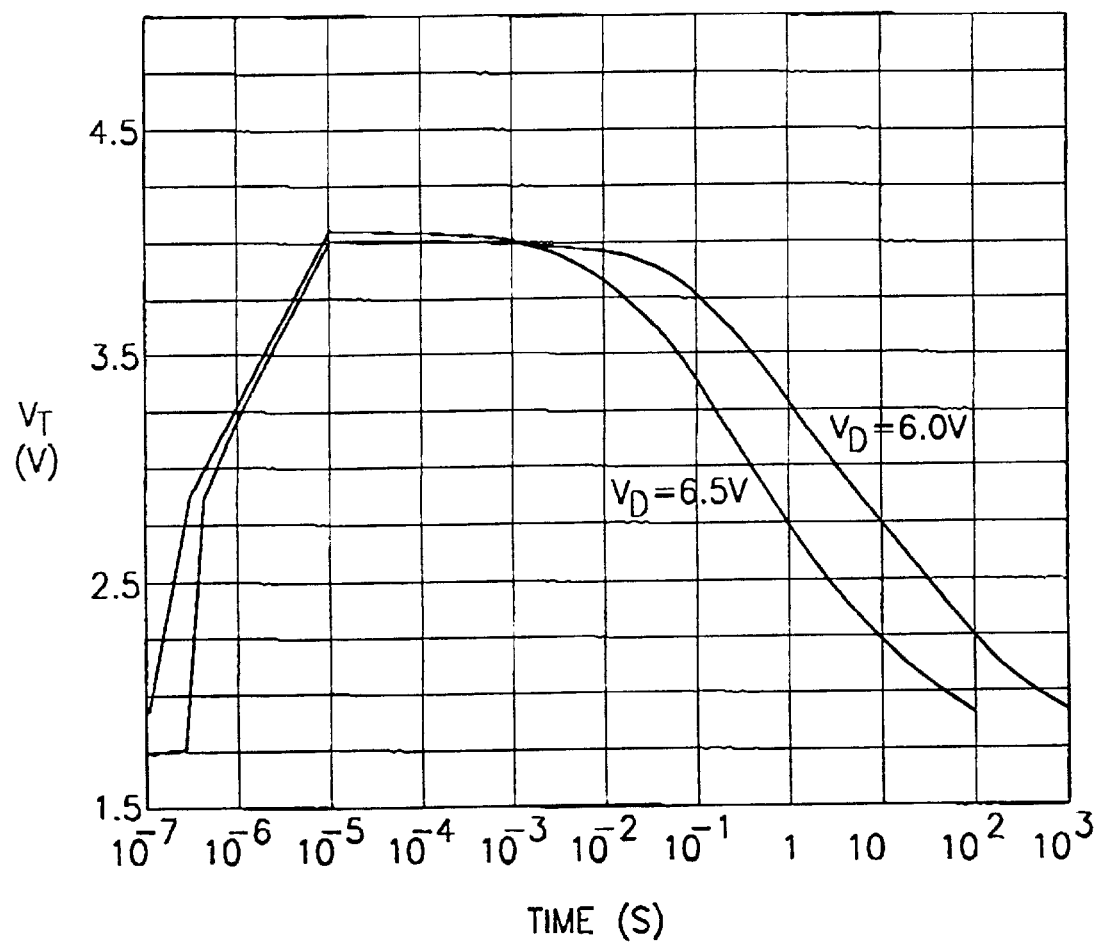
FIG. 22 is a graph illustrating the erase curves for two different values of drain voltage while the gate is held at ground potential.

A graph illustrating erase times for a gate voltage of zero with two different values of drain voltage is shown in FIG. 22. Both curves were generated by first programming in the forward direction for about 10 microseconds, until the threshold voltage $V_T$ equals about 4V and then erasing in the forward direction. For the upper curve, the gate 24 (FIG. 15) was grounded and 6.0V applied to the drain 16. For the lower curve, the gate 24 was grounded and 6.5V applied to the drain. For both curves, the threshold voltage is raised during programming from nearly 1.5V to approximately 4V. Erasing then brings the $V_T$ back down to approximately 1.7V. Note that the time to erase the charge from the dielectric decreases as the drain voltage increases. The curves show that it takes about 100 seconds with a gate voltage of 6.5V to erase (i.e., remove) sufficient charge from the dielectric to bring the threshold voltage of the device down to about 1.9V and that it takes about 1000 seconds with a gate voltage of 6.0V to achieve the same threshold voltage.

Figure 23:
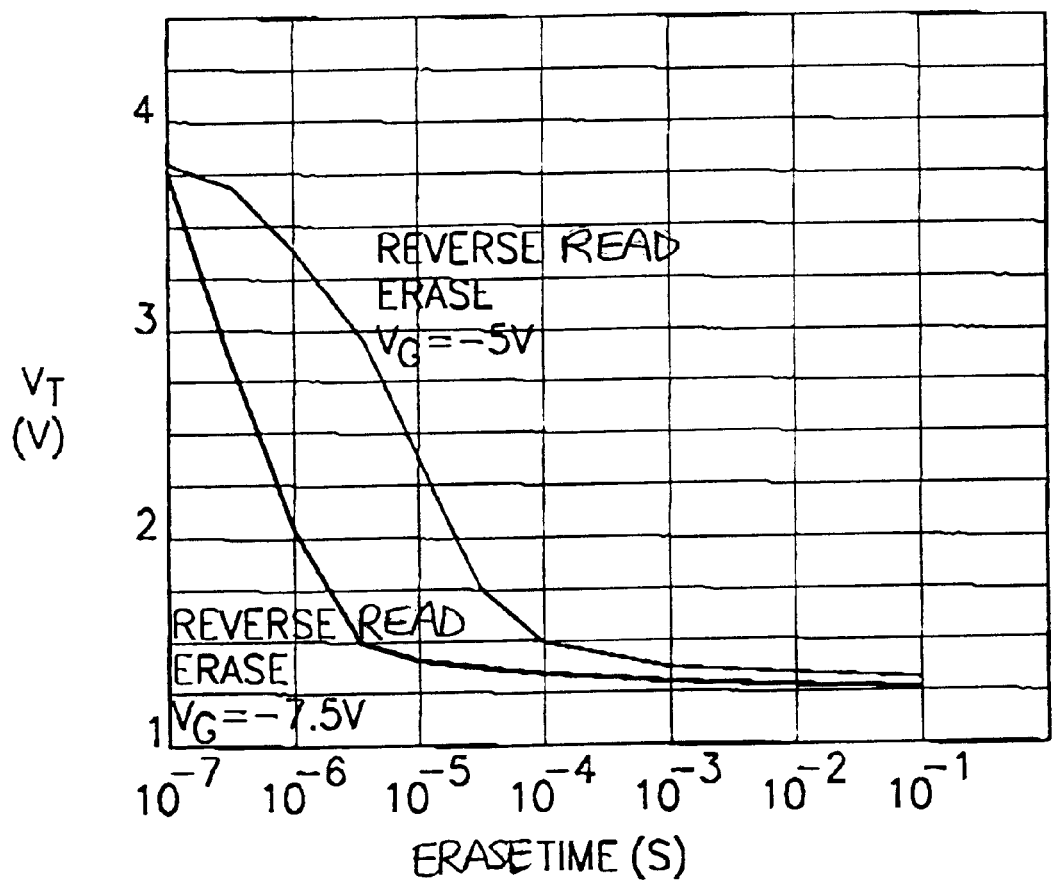
FIG. 23 is a graph illustrating the erase curve for two different values of gate voltage.

A graph illustrating the erase curve for two different values of negative gate voltage is shown in FIG. 23. The graph presented in FIG. 23 was constructed using data obtained from a memory cell constructed in accordance with the present invention. The thickness of each of the top oxide 22 (FIG. 15), bottom oxide 18 and nitride 20 layers is 100 Angstroms for a total dielectric thickness of 300 Angstroms. The channel width/length ratio is 0.6/0.65 microns. Erasing for the reverse direction utilized a constant $V_D$ of 5.5V and a $V_G$ of −5V versus a $V_G$ of −7.5V. The graph shows that drain and gate voltages on the order of 5V and −5V respectively, are sufficient to enable an effective erase. This is a big advantage over the prior art where erase voltages of around −10V on the gate are more typical. The graph also shows that lowering $V_G$ to −7.5V is effective to erase the device approximately 20 times faster while still retaining a $V_G$ less than 10V.

Benefits of Reading in the Reverse Direction

Reading the graph in FIG. 10, one can see that to achieve a $V_X$ equal to approximately 2V in the channel (i.e., the same conditions as the prior art memory device with 3V applied to the gate) when reading in the reverse direction, approximately 4V must be applied to the gate. When, for example, 3V is applied to the gate and the device is read in the reverse direction, only approximately 1.2V is generated in the channel. This is in direct contrast to the prior art reading in the forward direction wherein the potential across the trapped charge region was almost the full potential applied to the drain (i.e., 2V). This significant benefit of reading in the reverse direction is that for the same gate voltage a much lower voltage is present across the portion of the channel under the region of trapped charge. This results in dramatically less leakage current for the same charge trapping length. Or stated another way, a shorter charge trapping region is needed in the gate dielectric to achieve an equivalent amount of leakage current. A shorter charge trapping region translates through an exponential function to shorter programming times. A discussion of the variation in programming time as a function of various parameters, voltage and temperature is given in a paper entitled "Hot-Electron Injection Into the Oxide in n-Channel MOS Devices," B. Eitan and D. Frohman-Bentchkowsky, IEEE Transactions on Electron Devices, March 1981, incorporated herein by reference.

The effect of reading the memory device in the reverse direction is to amplify the effect of the trapped charge (i.e., the programmed region or the localized trapping region) on the threshold voltage thereby allowing much less charge to be trapped to achieve the same difference in threshold voltage between the programmed state (i.e., charge stored in the charge trapping region of the gate dielectric) and the unprogrammed state (i.e., no charge stored in the charge trapping region of the gate dielectric) of the device. For the same programming time (meaning the same length of trapped charge in the nitride, for example as shown in FIGS. 5A and 5B), device 10, when read in the reverse direction, exhibits a leakage current $I_L$ approximately two orders of magnitude less than that of a prior art memory cell. As previously discussed, by reading in the reverse direction, a major benefit is that the programming time can be reduced because the leakage current is significantly less and thus less trapped charge is required to achieve the same leakage current as when reading in the forward direction. Thus, the size of the trapping region does not have to be as large as with prior art memory cells which translates exponentially into shorter programming times.

A key advantage of reading in the opposite direction from programming is that the effect of the lateral electric field next to the charge trapping region is minimized. In addition, the gate voltage can be reduced to further minimize the potential in the channel. In fact, the gate voltage can be set to achieve the desired voltage in the channel. This was described previously with reference to FIG. 10.

Figure 24A:
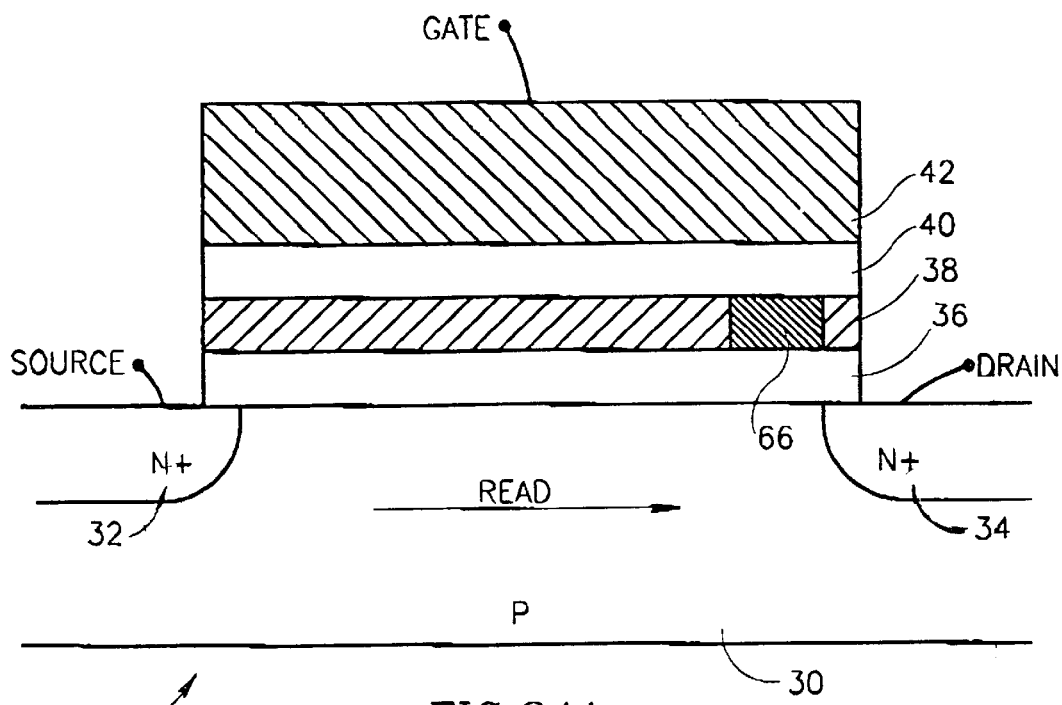
FIG. 24A illustrates a sectional view of a flash EEPROM cell of the prior art showing the area of charge trapping under the gate after being programmed for a period of time.
Figure 24B:
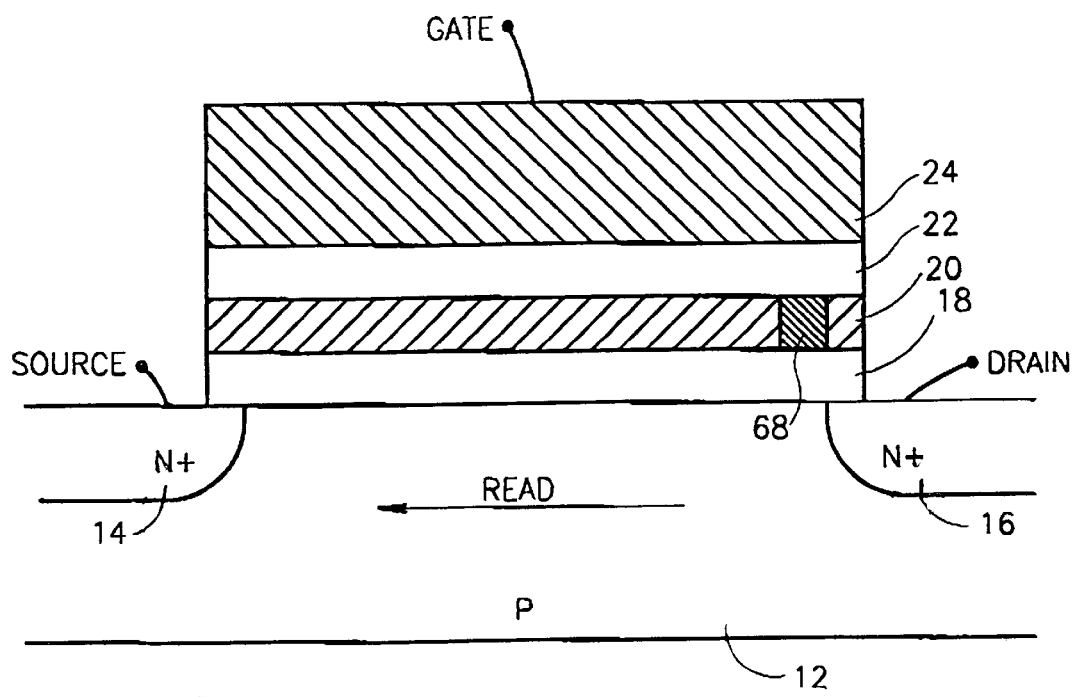
FIG. 24B illustrates a sectional view of a flash EEPROM cell constructed in accordance with an embodiment of the present invention showing the area of charge trapping under the gate after being programmed for a sufficient time to achieve the same threshold voltage of the cell illustrated in FIG. 24A.

The area of charge trapping necessary to program memory cell 41 of the prior art is illustrated in FIG. 24A and the area of charge trapping necessary to program memory cell 10 of the present invention is illustrated in FIG. 24B. The trapping region 68 of device 10 is shown much smaller than trapping region 66 of the prior art device. As described earlier, reading in the reverse direction permits a shorter charge trapping region. This results in much more efficient programming by reducing, through an exponential function, the programming time of the device.

Programming a smaller, narrower region of trapped charge has numerous benefits. One major benefit is that programming times are reduced while the delta in threshold voltage between the programmed versus unprogrammed states remains the same. Thus, short programming times are achieved by taking advantage of the asymmetric characteristics of the trapping dielectric flash EEPROM memory cell. Another major benefit is that the erase mechanism of the memory cell is greatly enhanced.

The erase mechanism is enhanced when the charge trapping region is made as narrow as possible. Programming in the forward direction and reading in the reverse direction enables limiting the width of the charge trapping region to a narrow region near the drain. This allows for much more rapid and thus more efficient erasing of the memory cell.

Yet another benefit of reading in the reverse direction, as described above, is that a narrow charge trapping region increases the effectiveness of the drain voltage during erase when combined with relatively low applied gate voltages. A narrow charge trapping region is allowed only by reading in the reverse direction while applying low gate voltages during the read.

Further, utilizing a thinner silicon nitride charge trapping layer than disclosed in the prior art helps to confine the charge trapping region to a region near the drain that is laterally narrower than in the prior art. This improves the retention characteristic of the memory cell. Further, the thinner top and bottom oxide sandwiching the nitride layer helps retain the vertical electric field.

In addition, when the memory cell is read in the reverse direction, it is more tolerant of over programming. Reading in the forward direction causes the threshold voltage of the memory cell to be very sensitive to inaccuracies in programming time while reading in the reverse direction reduces this sensitivity of threshold voltage to programming time. Over programming while programming to allow reading in the forward direction can potentially cause the device to become non erasable.

The voltage $V_X$ in the channel is a function of the gate voltage and the impurity level in the channel. $V_X$ is the voltage in the channel just beneath the edge of the trapped charge region above the channel (FIG. 5B). A higher gate voltage translates to a higher voltage in the channel. When the device is N channel, the impurity in the channel region before inversion is usually boron. The voltage $V_X$ is generally independent of the boron impurity level over a normal range of values in the forward reading mode, but $V_X$ is dependent on the impurity level in the reverse direction, becoming smaller as the impurity level goes up. Indeed in the reverse direction the voltage $V_X$ in the channel just beneath the edge of the trapped charge region is given by the following expression $$V_X = V_G - (V_T + \Delta V_T)$$

where $V_T$ is the device threshold voltage for zero substrate bias and $\Delta V_T$ is the incremental increase in threshold voltage due to substrate back bias caused by a finite value for $V_X$ when the channel is just inverted.

Various thicknesses were tried for the second oxide layer 22 in the ONO structure of FIGS. 5B and 24B. The following table presents the combinations of thicknesses' for the ONO layers that were constructed for three embodiments of the memory cell of this invention. Note that all thicknesses are in Angstroms in the table below.

| Layer | Embodiment #1 | Embodiment #2 | Embodiment #3 |
|---|---|---|---|
| Top Oxide ('O' Layer 22) | 150 | 100 | 70 |
| Nitride ('N' Layer 20) | 50 | 50 | 50 |
| Bottom Oxide ('O' Layer 18) | 70 | 70 | 70 |
| Total Thickness | 270 | 220 | 190 |

The nitride layer 20 retains the stored charge. By employing the reverse read as opposed to the forward read, the amount of charge required to be retained for a given shift in threshold voltage is reduced by a factor typically of two or more. By making the nitride layer 20 thinner and the top oxide layer 22 thicker, the amount of charge required to be stored on the nitride layer 20 for a given threshold voltage shift is also reduced.

It is also noted that as the thickness of the top oxide layer 22 increased, the lateral fields associated with the charge stored on the 50 Angstrom thick nitride layer 20 decreased slightly. It is also observed that as the thickness of the bottom oxide layer 18 was made thinner, the erase of the charge stored on the nitride layer 20 becomes easier. For a 70 Angstrom thick bottom oxide layer 18, the charge stored on the nitride layer 20 is more easily erased than if the bottom oxide layer 18 is 100 Angstroms thick.

Thus, the conclusion is that the thinner the nitride the better for the purposes of the present invention. Nitride layers as thin as 20 Angstroms are believed possible with this invention. The thinner nitride reduces the lateral field associated with a given charge stored in a portion of the nitride layer and thus reduces the lateral dispersion of the stored charge as a result of the internally generated electric field associated with the stored charge.

Optimization Parameters

In terms of optimization, three parameters can be varied to give the quickest programming time and the widest margins. The first parameter is the channel length. A longer channel length, for a given programming time when reading in the reverse direction, increases the distance between the drain and the trapped charge (effectively, the source and drain designations are flipped). This lowers the level of the lateral electric field even lower.

The second parameter, as described previously, is the gate voltage which can be set to minimize the voltage drop in the channel across the channel region beneath the trapped charge. This further reduces the lateral electric field in the channel beneath the trapped charge. Within limits, the voltage in the channel can be 'dialed in' by varying the voltage on the gate. This allows control over the voltage drop in the channel beneath the region of trapped charge. If the gate voltage is made too low then reading a logic '1', i.e., the unprogrammed state, becomes problematic. The gate voltage for reading a logic '1' must be still high enough to generate inversion in order to produce sufficient read current for each sense amplifier. Thus, a lower limit for the gate voltage is approximately 1V above the threshold voltage. The lower limit for the gate voltage is determined by the maximum time required to sense the channel current which represents one state of the memory cell. For example, for fast access time, the maximum time would be in the range of 10 to 30 nanoseconds while for a mass storage device the maximum access time could be as high as 1 microsecond. The actual gate voltage to achieve these maximum times would depend upon the device structure, the dielectric thickness, the bit line capacitance, the doping concentration in the channel and other parameters associated with the device. An upper limit on the gate voltage is the voltage at which the voltage in the channel just beneath the edge of the region of trapped charge is just below the voltage potential applied to the source terminal during reading in the reverse direction. A too high gate voltage will cause inversion in the channel and the benefits of the present invention are lost. Thus, it is not recommended to apply a gate voltage that generates such a high voltage in the channel beneath the edge of the charge trapping region because it defeats the benefits of having a lower potential across the portion of the channel beneath this charge trapping region with the accompanying reduction in leakage current and shortened programming time. In a preferred embodiment of the present invention, the gate voltage used for reading is approximately 3V which represents an optimized tradeoff between programming time and leakage current.

The third optimization method, previously described and which is known in the art, is to vary the boron doping of the channel region under the gate. An increase in the doping concentration results in a higher threshold voltage $V_T$ and a lower voltage generated in the channel. This is due to the reduction in the width of the depletion region formed. Thus, a higher doping concentration permits a higher gate voltage to be applied for the same voltage across the portion of the channel beneath the charge trapping region.

In addition, an increase in the $N_A$ doping concentration for the same length trapping region will improve the punch through behavior of the device. By varying the level of boron implanted in the channel region, the width of the depletion region under the gate can be varied. An increase in the doping concentration results in a reduction in the width of the depletion region for the same applied gate voltage. The reduction in the width of the depletion region occurs because there is now more fixed charge in the substrate. Thus, varying the doping concentration can be used to limit the length of the pinchoff region under the gate. In addition, the doping concentration can be used to increase or decrease the initial threshold voltage of the device.

Optimization parameters specific to programming and reading two bits in the memory cell of the present invention will now be described. The optimizations for programming include utilizing a longer minimum effective channel length Leer in order to physically separate the two bits better. In addition, the implant level can be reduced in the channel in order to increase the delta between forward and reverse programming. On the other hand, the implant level can be increased in the channel in order to reduce the impact of the first bit on the programming of the second bit. Thus, the implant level in the channel is a compromise between the forward and reverse delta on the one hand and the programming speed on the other hand.

The optimizations for reading include lowering the gate voltage in order to enhance the punch through during reading. As described previously, punch through is necessary to program and read the second bit. A lower implant level in the channel serves to increase punch through. Also, a higher drain voltage during read functions to increase punch through. These three optimizations relate to reading in the forward direction, which is equivalent to reading the second bit in the reverse.

In addition, a lower gate voltage reduces the number of electrons that need to be injected into the charge trapping region. This improves erasing because it eliminates residual charge remaining trapped after erasure. Any residual charge that remains in the charge trapping layer after erasure degrades cycling.

While the invention has been described with respect to a limited number of embodiments, it will be appreciated that many variations, modifications and other applications of the invention may be made.

What is claimed is:

1. An electrically erasable programmable read only memory (EEPROM) cell capable of storing a first bit and a second bit of information, said cell comprising:

a semiconducting substrate of a first conductivity type;

a first region comprising a portion of said semiconducting substrate doped to have a conductivity opposite that of said semiconducting substrate;

a second region, spaced from said first region, comprising a portion of said semiconducting substrate doped to have a conductivity opposite that of said semiconducting substrate, a channel being formed in the space between said first region and said second region within said semiconducting substrate;

a first insulating layer overlaying and covering said channel portion of said semiconducting substrate;

a nonconducting charge trapping layer formed on and overlaying said first insulating layer;

a second insulating layer formed on and overlaying said nonconductive charge trapping layer;

a gate comprising an electrically conductive material formed on and overlaying said second insulating layer;

wherein said charge trapping layer is formed to allow first information bit programming in a first forward direction, said first information bit programming comprising electron injection into a first charge storage region of said charge trapping layer substantially directly above said channel such that first quantity of electrons is received and retained to provide said cell with a first threshold voltage greater than a first selected value when said first bit is read in said first forward direction and to provide said cell with a second threshold voltage when said first bit is read in a direction opposite said first forward direction, said first threshold voltage being sufficiently less than said second threshold voltage so as to allow said cell to store said first information bit when said first bit is read in said direction opposite said first forward direction but to not store said first information bit with the same probability of detecting said first information bit when said first bit is read in said first forward direction;

wherein said charge trapping layer is formed to allow second information bit programming in a second forward direction, said information bit programming comprising electron injection into a second charge storage region of said charge trapping layer sustantially directly above said channel such that a second quantity of electrons is received and retained to provide said cell with a third threshold voltage greater than a third selected value when said second bit is read in said second forward direction and to provide said cell with a fourth threshold voltage when said second bit is read in a direction opposite said second forward direction, said third threshold voltage being sufficiently less than said fourth threshold voltage so as to allow said cell to store said second information bit when said second bit is read in said direction opposite said second forward direction but to not store said second information bit with the same probability of detecting said second information bit when said second bit is read in said second forward direction, and wherein said first and second bits are separately readable and erasable.

2. The memory cell according to claim 1, wherein the amount of charge stored in said first and said second charge storage regions for representing said first and said third binary values respectively is such that the ratio of the threshold voltage for reading in said first and said second reverse directions to the threshold voltage for reading in said first and said second forward directions is greater than ten to one.

3. The memory cell according to claim 1, wherein the amount of charge stored in said first and said second charge storage regions for representing said first and said third binary values respectively is such that the ratio of the threshold voltage for reading in said first and said second reverse directions to the threshold voltage for reading in said first and said second forward directions is greater than five to one.

4. The memory cell according to claim 1, wherein the amount of charge stored in said first and said second charge storage regions for representing said first and said third binary values respectively is such that the ratio of the threshold voltage for reading in said first and said second reverse directions to the threshold voltage for reading in said first and said second forward directions is greater than two to one.

5. The memory cell according to claim 1, wherein the amount of charge stored in said first and said second charge storage regions for representing said first and said third binary values respectively is such that the ratio of the threshold voltage for reading in said first and said second reverse directions to the threshold voltage for reading in said first and said second forward directions is greater than one and one half to one.

6. The memory cell according to claim 1, wherein said cell is adapted:

such that a lower limit for the voltage applied to said gate when reading the binary state of either said first or said second information bit is the voltage at which sufficient inversion is generated in said channel whereby a non-trapped charge state of the bit being read can be sensed and which permits read through of the bit not being read; and such that an upper limit for the voltage applied to said gate when reading the binary state of either said first or said second information bit is the voltage at which the voltage across a region of said channel underlying said first charge storage region is below the voltage applied to said first region when reading the state of said first information bit, and the voltage across a region of said channel underlying said second charge storage region is below the voltage applied to said second region when reading the state of said second information bit.

7. The memory cell according to claim 1:

wherein said cell is adapted such that said first programming comprises applying programming voltages to said first region and said gate, and grounding said second region;

wherein said cell is adapted such that reading said first information bit comprises applying reading voltages to said second region and said gate, grounding said first region, and measuring the resulting channel current;

wherein said cell is adapted such that said second programming comprises applying programming voltages to said second region and said gate, and grounding said first region; and wherein said cell is adapted such that reading said second information bit comprises applying reading voltages to said first region and said gate, grounding said second region, and measuring the resulting channel current.

8. The memory cell according to claim 1, wherein said cell is adapted such that first information bit erasing comprises applying erasing voltages to said gate and said first region, and wherein said cell is adapted such that second information bit erasing comprises applying erasing voltages to said gate and said second region.

9. The memory cell according to claim 1, wherein said cell is adapted such that first information bit erasing comprises applying a first voltage on said gate and ground potential on said first region such that electrons are removed from said first charge storage region via said gate, and wherein said cell is adapted such that second information bit erasing comprises applying a second voltage on said gate and ground potential on said second region such that electrons are removed from said second charge storage region via said gate.

10. The memory cell according to claim 1, wherein said cell is adapted such that first information bit erasing comprises applying a first voltage to said gate and a second voltage to said first region such that electrons are removed from said first charge storage region via said first region, and wherein said cell is adapted such that second information bit erasing comprises applying a third voltage to said gate and a fourth voltage to said second region such that electrons are removed from said second charge storage region via said second region.

11. The memory cell according to claim 1, wherein said first and second insulating layers comprise silicon dioxide.

12. The memory cell according to claim 1, wherein said charge trapping layer comprises silicon nitride.

13. The memory cell according to claim 1, wherein said charge trapping layer comprises silicon dioxide with buried polysilicon islands.

14. The memory cell according to claim 1 wherein said charge trapping layer comprises silicon dioxide with impurities therein.

15. The memory cell according to claim 1, wherein said semiconducting substrate comprises P type semiconductor material.

16. The memory cell according to claim 1, wherein said first and said second regions comprise N+ semiconductor material.

17. An electrically erasable programmable read only memory (EEPROM) cell capable of storing a first bit and a second bit of information, said cell comprising:

a semiconducting substrate of a first conductivity type;

a first region comprising a portion of said semiconducting substrate doped to have a conductivity opposite that of said semiconducting substrate;

a second region, spaced from said first region, comprising a portion of said semiconducting substrate doped to have a conductivity opposite that of said semiconducting substrate, a channel being formed between said first region and said second region within said semiconducting substrate;

a first insulating layer overlaying and covering said channel portion of said semiconducting substrate;

a non conductive charge trapping layer formed on and overlaying said first insulating layer;

a second insulating layer formed on and overlaying said non conductive charge trapping layer;

a gate comprising an electrically conductive material formed on and overlaying said second insulating layer;

wherein said cell is adapted to allow programming comprising storing a first information bit by receiving and retaining electrons injected into said non conductive charge trapping layer in a first trapping region substantially directly above said channel to represent a first binary value and not receiving electrons in said first trapping region to represent a second binary value and storing a second information bit by receiving and retaining electrons injected into said non conductive charge trapping layer in a second trapping region close to said second region to represent a third binary value and not receiving electrons in said second trapping region to represent a fourth binary value; and wherein each said bit is adapted to be read in a direction opposite to that in which it was programmed such that a lower limit for the voltage applied to said gate during reading for either said first bit or said second bit is the voltage at which sufficient inversion is generated in said channel whereby a non-trapped charge state of the bit being read can be sensed and read through of the bit not being read is permitted, and an upper limit for the voltage applied to said gate during reading for either said first bit or said second bit is the voltage at which the voltage across a region of said channel beneath a trapped charge in said first or said second trapping region is below the voltage applied to said first region during reading for said first bit and below the voltage applied to said second region during reading for said second bit and wherein said first and second bits are separably readable and erasable.

18. The memory cell according to claim 17, wherein said cell is adapted to allow said first information bit and said second information bit to be erased by removing electrons from respective trapping regions in said non conductive charge trapping layer previously stored therein during said programming.

19. The memory cell according to claim 17:
wherein said cell is adapted to have said first information bit be programmed by applying programming voltages to said first region and said gate, and a reference voltage to said second region;
wherein said cell is adapted to have said first information bit be read by applying reading voltages to said second region and said gate, applying said reference voltage to said first region, and measuring the resulting channel current;
wherein said cell is adapted to have said second information bit be programmed by applying programming voltages to said second region and said gate, and said reference voltage to said first region; and
wherein said cell is adapted to have said second information bit be read by applying reading voltages to said first region and said gate, applying said reference voltage to said second region, and measuring the resulting channel current.

20. The memory cell according to claim 19, wherein said reference voltage is ground.

21. The memory cell according to claim 17, wherein said cell is adapted to have said first information bit be erased by applying erasing voltages to said gate and said first region, and wherein said cell is adapted to have said second information bit be erased by applying erasing voltages to said gate and said second region.

22. The memory cell according to claim 17, wherein said cell is adapted to have said first information bit be erased by applying a first voltage to said gate and a reference voltage to said first region such that electrons are removed from said first trapping region via said gate, and wherein said cell is adapted to have said second information bit be erased by applying a second voltage to said gate and said reference voltage to said second region such that electrons are removed from said second trapping region via said gate.

23. The memory cell according to claim 22, wherein said reference voltage is ground.

24. The memory cell according to claim 17, wherein said cell is adapted to have said first information bit be erased by applying a first voltage to said gate and a second voltage to said first region such that electrons are removed from said first trapping region via said first region, and wherein said cell is adapted to have said second information bit be erased by applying a third voltage to said gate and a fourth voltage to said second region such that electrons are removed from said second trapping region via said second region.

25. The memory cell according to claim 17, wherein said first and second insulating layers comprise silicon dioxide.

26. The memory cell according to claim 17, wherein said charge trapping layer comprises silicon nitride.

27. The memory cell according to claim 17, wherein said charge trapping layer comprises silicon dioxide with buried polysilicon islands.

28. The memory cell according to claim 17, wherein said charge trapping layer comprises silicon dioxide with impurities therein.

29. The memory cell according to claim 17, wherein said semiconducting substrate comprises P-type semiconductor material.

30. The memory cell according to claim 17, wherein said first and said second regions comprise N+ semiconductor material.

31. A. An electrically erasable programmable read only memory (EEPROM) cell capable of storing a first bit and a second bit of information, said cell comprising:
a semiconducting substrate of a first conductivity type;
a first region comprising a portion of said semiconducting substrate doped to have a conductivity type opposite that of said semiconducting substrate;
a second region, spaced from said first region, comprising a portion of said semiconducting substrate doped to have a conductivity opposite that of said semiconducting substrate, a channel being formed-between said first region and said second region within said semiconducting substrate;
a first insulating layer overlaying and covering said channel portion of said semiconducting substrate;
a non conductive charge trapping layer formed on and overlaying said first insulating layer;
a second insulating layer formed on and overlaying said non conductive charge trapping layer;
a gate comprising an electrically conductive layer formed on and overlaying said second insulating layer;
wherein said memory cell is adapted to be programmed by forming a first bit such that hot electron injection into said non conductive charge trapping layer in a first storage region substantially direct above said channel represents a first binary value and no electron injection into said first storage region represents a second binary value, and by forming a second bit such that hot electron injection into said non conductive charge trapping layer in a second storage region substantially directly above said channel represents a third binary value and no electron injection into said second storage region represents a fourth binary value;

wherein each said bit is adapted to be read in a direction opposite from that in which it was programmed such that a maximum gate voltage applied to said gate during reading the binary state of either said first bit or said second bit is the voltage at which the voltage across a region of said channel underlying said first storage region is below the voltage applied to said first region when reading the state of said first bit and the voltage across a region of said channel underlying said second storage region is below the voltage applied to said second region when reading the state of said second bit; and wherein said cell is adapted to be erased by applying ground potential to said gate and removing electrons from said first storage region via said first region to erase said first bit, and removing electrons from said second storage region via said second region to erase said second bit and wherein said first and second bits are separately readable and erasable.

32. An electrically erasable programmable read only memory (EEPROM) cell capable of storing a first bit and a second bit of information, said cell comprising:

a semiconducting substrate of a first conductivity type;

a first region comprising a portion of said semiconducting substrate doped to have a conductivity type opposite that of said semiconducting substrate;

a second region, spaced from said first region, comprising a portion of said semiconducting substrate doped to have a conductivity type opposite that of said semiconducting substrate, a channel being formed in the space between said first region and said second region within said semiconducting substrate;

a first insulating layer overlaying and covering said channel portion of said semiconducting substrate;

a non conductive charge trapping layer formed on and overlaying said first insulating layer;

a second insulating layer formed on and overlaying said non conductive charge trapping layer;

a gate comprising an electrically conductive layer formed on and overlaying said second insulating layer;

wherein said memory cell is adapted to be programmed by forming a first bit such that hot electron injection into said non conductive charge trapping layer in a first storage region substantially directly above said channel represents a first binary value and no electron injection into said first storage region represents a second binary value, and by forming a second bit such that hot electron injection into said non conductive charge trapping layer in a second storage region substantially directly above said channel represent a third binary value and no electron injection into said second storage region represents a fourth binary value;

wherein each said bit is adapted to be read in a direction opposite from that in which it was programmed, said cell being adapted such that a maximum gate voltage applied to said gate during either said first bit or said second bit is the voltage at which the voltage across a region of said channel beneath a trapped charge in said first or said second storage region is below the voltage applied to said first region during reading for said first bit and below the voltage applied to said second region during reading for said second bit; and wherein said cell is adapted to be erased by applying a negative potential to said gate and removing electrons from said first storage region via said first region to erase said first bit, and removing electrons from said second storage region via said second region to erase said second bit and wherein said first and second bits are separately readably and erasable.

33. A semiconductor memory cell capable of storing a first bit and a second bit of information, said cell comprising:

a substrate of a first conductivity type including a first region of a second conductivity type opposite said first conductivity type and a second region of said second conductivity type, said first region and second region being respectively spaced from each other by a channel region normally of said first conductivity type formed therebetween;

a dielectric capable of holding an electrical charge in a first charge trapping region thereof substantially directly above said channel and in a second charge trapping region substantially directly above said channel;

a conductive gate formed over said dielectric;

means for programming a first bit by applying a first voltage to said first region and a second voltage to said gate, thereby to cause electrons to be lodged on and stored in said first charge trapping region so as to represent a first binary value, and for not applying said first and said second voltages so as to represent a second binary value;

means for programming a second bit by applying a third voltage to said second region and said second voltage to said gate, thereby to cause electrons to be lodged on and stored in said second charge trapping region so as to represent a third binary value, and for not applying said third and said second voltages so as to represent a fourth binary value;

means for applying a fourth voltage to said second region and a fifth voltage to said gate thereby to cause a current to be read indicating the presence or absence of a stored charge in said first charge trapping region representing said first or said second binary value stored in said first bit, said fifth voltage being between a sixth voltage sufficient to invert said channel with no charge in said first charge trapping region and a seventh voltage sufficient to create a voltage beneath said fourth voltage at a point in said channel beneath an edge of said first charge trapping region with charge stored therein; and means for applying an eighth voltage to said first region and a ninth voltage to said gate thereby to cause a current to be read indicating the presence or absence of a stored charge in said second charge trapping region representing said third or said fourth binary value stored in said second bit, said ninth voltage being between a tenth voltage sufficient to invert said channel with no charge in said second charge trapping region and an eleventh voltage sufficient to create a voltage beneath said ninth voltage at a point in said channel beneath an edge of said second charge trapping region with charge stored therein and means for separably read and erase said first and second bit.

34. The memory cell according to claim 33, wherein said dielectric further comprises:

a first layer of silicon dioxide formed on said substrate;

a layer of silicon nitride formed on said first layer of silicon dioxide, said layer of silicon nitride being capable of retaining charge in a first selected portion thereof to represent a binary value stored in said first bit and in a second selected portion thereof to represent a binary value stored in said second bit; and a second layer of silicon dioxide formed on said silicon nitride, said second layer of silicon dioxide formed to assist said silicon nitride in retaining charge trapped in said first and said second selected portions despite the electric fields generated therein.

35. An electrically erasable programmable read only memory (EEPROM) cell capable of storing a first bit and a second bit of information, said cell comprising:

semiconducting substrate of a first conductivity type;

a first region comprising a portion of said semiconducting substrate doped to have a conductivity opposite that of said semiconducting substrate;

a second region, spaced from said first region, comprising a portion of said semiconducting substrate doped to have a conductivity opposite that of said semiconducting substrate, a channel being formed in the space between said first region and said second region within said semiconducting substrate;

a first insulating layer overlaying and covering said channel portion of said semiconducting substrate;

a nonconducting charge trapping layer formed on and overlaying said first insulating layer;

a second insulating layer formed on and overlaying said nonconducting charge trapping layer;

a gate comprising an electrically conductive material formed on and overlaying said second insulating layer;

wherein said charge trapping layer is formed to allow first information bit programming in a first forward direction, said first information bit programming comprising charge injection into a first charge storage region of said charge trapping layer substantially directly above said channel such that a first quantity of charge is received and retained to provide said cell with a first threshold voltage greater than a first selected value when said first bit is read in said first forward direction and to provide said cell with a second threshold voltage when said first bit is read in a direction opposite said first forward direction, said first threshold voltage being sufficiently less than said second threshold voltage so as to allow said cell to store said first information bit when said first bit is read in said direction opposite said first forward direction but to not store said first information bit with the same probability of detecting said first information bit when said first bit is read in said first forward direction;

wherein said charge trapping layer is formed to allow second information bit programming in a second forward direction, said second information bit programming comprising charge injection into a second charge storage region of said charge trapping layer substantially directly above said channel such that a second quantity of charge is received and retained so as to provide said cell with a third threshold voltage greater than a third selected value when said second bit is read in said second forward direction and to provide said cell with a fourth threshold voltage when said second bit is read in a direction opposite said second forward, said third threshold voltage being sufficiently less than said fourth threshold voltage so as to allow said cell to store said second information bit when said second bit is read in said direction opposite said second forward direction but to not store said second information bit with the same probability of detecting said second information bit when said second bit is read in said second forward direction, and wherein said first and second bits are separately readable and erasable.

36. An electrically erasable programmable read only memory (EEPROM) cell capable of storing a first bit and a second bit of information, said cell comprising:

a semiconducting substrate of a first conductivity type;

a first region comprising a portion of said semiconducting substrate doped to have a conductivity opposite that of said semiconducting substrate;

a second region, spaced from said first region, comprising a portion of said semiconducting substrate doped to have a conductivity opposite that of said semiconducting substrate, a channel being formed between said first region and said second region within said semiconducting substrate;

a first insulating layer overlaying and covering said channel portion of said semiconducting substrate;

a non conducting charge trapping layer formed on and overlaying said first insulating layer;

a second insulating layer formed on and overlaying said non conducting charge trapping layer;

a gate comprising an electrically conductive material formed on and overlaying said second insulating layer;

wherein said cell is adapted to allow programming comprising receiving and retaining electrons injected into said non conducting charge trapping layer in a first trapping region substantially directly above said channel to form a first bit and in a second trapping region substantially directly above said channel to form a second bit; and wherein each said bit is adapted to be read in a direction opposite to that in which it was programmed such that a lower limit for the voltage applied to said gate during reading for either said first bit or said second bit is the voltage at which sufficient inversion is generated in said channel whereby an unprogrammed state of the bit being read can be sensed and read through of the bit not being read is permitted, and an upper limit for the voltage applied to said gate during reading for either said first bit or said second bit is the lowest voltage for which a programmed value of said first or second bit can be read without affecting the programmed/non-programmed state of said second or first bit.

* * * * *